United States Patent
Fujii et al.

(10) Patent No.: US 8,716,412 B2
(45) Date of Patent: May 6, 2014

(54) SILICONE RESIN COMPOSITION, ENCAPSULATING LAYER, REFLECTOR, AND OPTICAL SEMICONDUCTOR DEVICE

(75) Inventors: Haruka Fujii, Osaka (JP); Hiroyuki Katayama, Osaka (JP)

(73) Assignee: Nitto Denko Corporation, Osaka (JP)

( * ) Notice: Subject to any disclaimer, the term of this patent is extended or adjusted under 35 U.S.C. 154(b) by 70 days.

(21) Appl. No.: 13/524,236

(22) Filed: Jun. 15, 2012

(65) Prior Publication Data
US 2012/0319154 A1  Dec. 20, 2012

(30) Foreign Application Priority Data

Jun. 16, 2011 (JP) ................. 2011-134575
Jun. 16, 2011 (JP) ................. 2011-134576
Jun. 16, 2011 (JP) ................. 2011-134577

(51) Int. Cl.
*C08L 83/04* (2006.01)

(52) U.S. Cl.
USPC ............. 525/477; 428/447; 525/478; 528/15; 528/31; 528/32

(58) Field of Classification Search
None
See application file for complete search history.

(56) References Cited

U.S. PATENT DOCUMENTS

| 6,252,030 | B1 | 6/2001 | Zank et al. | |
| 8,299,198 | B2* | 10/2012 | Manabe et al. | 528/31 |
| 2009/0225640 | A1 | 9/2009 | Manabe et al. | |
| 2011/0112268 | A1 | 5/2011 | Katayama | |
| 2012/0112211 | A1* | 5/2012 | Fujii et al. | 257/79 |
| 2013/0099395 | A1* | 4/2013 | Ona et al. | 257/791 |

FOREIGN PATENT DOCUMENTS

| EP | 2450393 A1 | 5/2012 |
| EP | 2 586 831 A1 | 5/2013 |
| JP | 2000-154252 A | 6/2000 |
| JP | 2002-069191 A | 3/2002 |
| JP | 2007-251122 * | 7/2007 |

OTHER PUBLICATIONS

European Search Report issued in Application No. 12172187.2 dated Aug. 3, 2012.
European Search Report issued in corresponding EP application No. 12172187.2, dated Jul. 22, 2013.

\* cited by examiner

*Primary Examiner* — Marc Zimmer
(74) *Attorney, Agent, or Firm* — Sughrue Mion, PLLC

(57) ABSTRACT

A silicone resin composition includes a cage octasilsesquioxane; a polysiloxane containing alkenyl groups at both ends containing an alkenyl group having the number of moles smaller than the number of moles of the hydrosilyl group of the cage octasilsesquioxane; a hydrosilylation catalyst; a hydroxyl group-containing polysiloxane, organohydrogenpolysiloxane, or a polysiloxane containing alkenyl groups at side chain.

9 Claims, 1 Drawing Sheet

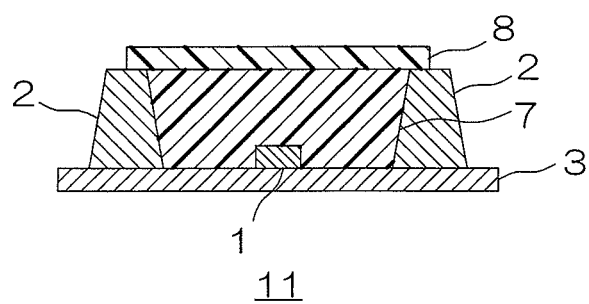

SILICONE RESIN COMPOSITION, ENCAPSULATING LAYER, REFLECTOR, AND OPTICAL SEMICONDUCTOR DEVICE

CROSS-REFERENCE TO RELATED APPLICATION

The present application claims priority from Japanese Patent Application No. 2011-134575 filed on Jun. 16, 2011, Japanese Patent Application No. 2011-134576 filed on Jun. 16, 2011, and Japanese Patent Application No. 2011-134577 filed on Jun. 16, 2011, the contents of which are hereby incorporated by reference into this application.

BACKGROUND OF THE INVENTION

1. Field of the Invention

The present invention relates to a silicone resin composition, an encapsulating layer, a reflector, and an optical semiconductor device, in particular to a silicone resin composition, an encapsulating layer composed of the silicone resin composition, a reflector containing the silicone resin composition, and an optical semiconductor device including these.

2. Description of Related Art

Conventionally, a silicone resin excellent in transparency has been used as an encapsulating material for encapsulating optical semiconductor elements such as a light-emitting diode (LED). Such a silicone resin is liquid at room temperature. The silicone resin is applied to an optical semiconductor element, and then cured by heating, thereby encapsulating an optical semiconductor element.

Furthermore, in view of storage stability and handleability, a silicone resin that is solid at room temperature is also used. As such a solid silicone resin, for example, Japanese Unexamined Patent Publication No. 2000-154252 has proposed a silsesquioxane-containing polymer obtained by allowing pentacyclo[9.5.1.1$^{3.9}$.1$^{5.15}$.1$^{7.13}$]octasiloxane to react with 1,3-divinyltetramethyldisiloxane.

Also, Japanese Unexamined Patent Publication No. 2002-69191 has proposed a polysiloxane obtained by allowing hydrogenated octasilsesquioxane to react with disilanol.

The encapsulating materials proposed in Japanese Unexamined Patent Publication No. 2000-154252 and Japanese Unexamined Patent Publication No. 2002-69191 are plasticized by heating, thereby encapsulating optical semiconductor elements.

SUMMARY OF THE INVENTION

However, in view of improving heat resistance and durability, it has been desired that a solid silicone resin is plasticized by heating, and then cured. However, the encapsulating materials of Japanese Unexamined Patent Publication No. 2000-154252 and Japanese Unexamined Patent Publication No. 2002-69191 are disadvantageous in that they cannot be cured.

Furthermore, it has been desired that the silicone resin is cured at a comparatively low temperature.

Meanwhile, an improvement in flexibility of encapsulating materials is desired in order to prevent damages to optical semiconductor elements.

An object of the present invention is to provide a silicone resin composition that has excellent transparency and heat resistance, has both thermoplastic and thermosetting properties, achieves a decreased thermosetting temperature, and has excellent flexibility; an encapsulating layer composed of the silicone resin composition; a reflector containing the silicone resin composition; and an optical semiconductor device including these.

The first invention group is as follows.

A silicone resin composition of the present invention contains a cage octasilsesquioxane having a group represented by formula (1) below; an alkenyl group-containing polysiloxane containing an alkenyl group having the number of moles smaller than the number of moles of the hydrosilyl group of the cage octasilsesquioxane; a hydrosilylation catalyst; and a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

In the silicone resin composition of the present invention, it is preferable that the cage octasilsesquioxane is represented by formula (2) below:

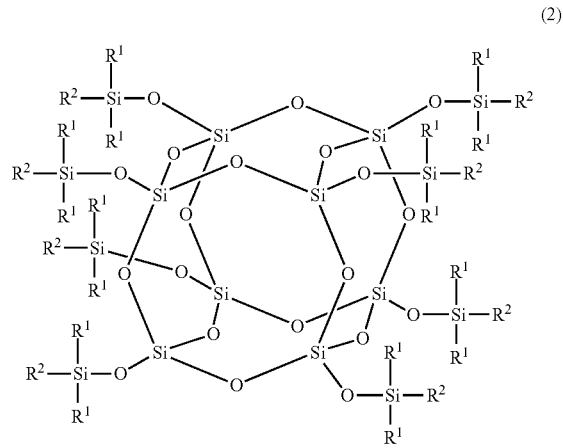

(where $R^1$ and $R^2$ are as defined above; and the molar ratio of monovalent hydrocarbon group:hydrogen in $R^2$ is the same as above).

In the silicone resin composition of the present invention, it is preferable that the alkenyl group-containing polysiloxane is represented by formula (3) below:

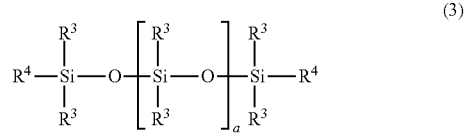

(where $R^3$ represents a monovalent hydrocarbon group; $R^4$ represents an alkenyl group; and "a" represents an integer of 1 or more).

In the silicone resin composition of the present invention, it is preferable that the hydroxyl group-containing polysiloxane is represented by formula (4) below:

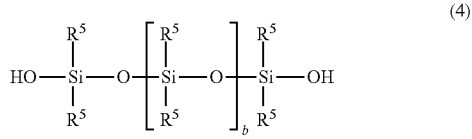

(where $R^5$ represents a monovalent hydrocarbon group; and "b" represents an integer of 1 or more).

It is preferable that the silicone resin composition of the present invention includes a silicone resin precursor and the hydroxyl group-containing polysiloxane, wherein the silicone resin precursor is obtained by allowing the cage octasilsesquioxane to react with the alkenyl group-containing polysiloxane in the presence of the hydrosilylation catalyst.

An encapsulating layer of the present invention is an encapsulating layer used for encapsulating an optical semiconductor element, wherein the encapsulating layer is formed from a silicone resin composition, and the silicone resin composition contains a cage octasilsesquioxane having a group represented by formula (1) below; an alkenyl group-containing polysiloxane containing an alkenyl group having the number of moles smaller than the number of moles of the hydrosilyl group of the cage octasilsesquioxane; a hydrosilylation catalyst; and a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

An optical semiconductor device of the present invention includes an optical semiconductor element, and an encapsulating layer that encapsulates the optical semiconductor element, wherein the encapsulating layer is formed from a silicone resin composition, and the silicone resin composition contains a cage octasilsesquioxane having a group represented by formula (1) below; an alkenyl group-containing polysiloxane containing an alkenyl group having the number of moles smaller than the number of moles of the hydrosilyl group of the cage octasilsesquioxane; a hydrosilylation catalyst; and a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

A reflector of the present invention is a reflector used for reflecting light emitted from an optical semiconductor element, wherein the reflector is formed from a light reflective composition containing a silicone resin composition and a light reflective component, and the silicone resin composition contains a cage octasilsesquioxane having a group represented by formula (1) below; an alkenyl group-containing polysiloxane containing an alkenyl group having the number of moles smaller than the number of moles of the hydrosilyl group of the cage octasilsesquioxane; a hydrosilylation catalyst; and a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

An optical semiconductor device of the present invention includes an optical semiconductor element and a reflector that reflects light emitted from the optical semiconductor element, wherein the reflector is formed from a light reflective composition containing a silicone resin composition and a light reflective component, and the silicone resin composition contains a cage octasilsesquioxane having a group represented by formula (1) below; an alkenyl group-containing polysiloxane containing an alkenyl group having the number of moles smaller than the number of moles of the hydrosilyl group of the cage octasilsesquioxane; a hydrosilylation catalyst; and a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

The silicone resin composition in the first invention group of the present invention has a molar ratio of monovalent hydrocarbon group:hydrogen in $R^2$ in a specific range, and therefore in the cage octasilsesquioxane, the proportion of the hydrosilyl group to be reacted with the alkenyl group of the alkenyl group-containing polysiloxane is adjusted. Moreover, the alkenyl group-containing polysiloxane is allowed to react with the cage octasilsesquioxane so that the number of moles of the alkenyl group is smaller than the number of moles of the hydrosilyl group of the cage octasilsesquioxane. Therefore, the obtained silicone resin composition has excellent transparency and heat resistance, and can have both thermoplastic and thermosetting properties.

Furthermore, the silicone resin composition contains a hydroxyl group-containing polysiloxane, and therefore the hydroxyl group in the hydroxyl group-containing polysiloxane is allowed to react with the residual hydrosilyl group in the cage octasilsesquioxane, thereby allowing improvement in flexibility of the silicone resin composition.

Furthermore, the silicone resin composition achieves a decreased thermosetting temperature.

Thus, the encapsulating layer of the present invention composed of the above-described silicone resin composition in the first invention group is plasticized by heating at the time of encapsulation, and thereafter is cured at low temperature, thereby allowing encapsulation of the optical semiconductor element while preventing damages effectively.

In the optical semiconductor device in the first invention group of the present invention, the optical semiconductor element is encapsulated by the above-described encapsulating layer, and therefore has excellent optical properties and heat resistance, and also has excellent reliability, mechanical strength, and durability.

The reflector of the present invention containing the above-described silicone resin composition in the first invention group has excellent heat resistance, flexibility, and thermoplastic and thermosetting properties.

Thus, the optical semiconductor device of the present invention including the above-described reflector in the first invention group has excellent optical properties and heat resistance, and also has excellent flexibility, mechanical strength, and durability.

The second invention group is as follows.

A silicone resin composition of the present invention contains a cage octasilsesquioxane having a group represented by formula (1) below, an alkenyl group-containing polysiloxane containing an alkenyl group having the number of moles smaller than the number of moles of the hydrosilyl group of the cage octasilsesquioxane, a hydrosilylation catalyst, and organohydrogenpolysiloxane,

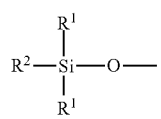
(1)

(where $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

In the silicone resin composition of the present invention, it is preferable that the cage octasilsesquioxane is represented by formula (2) below,

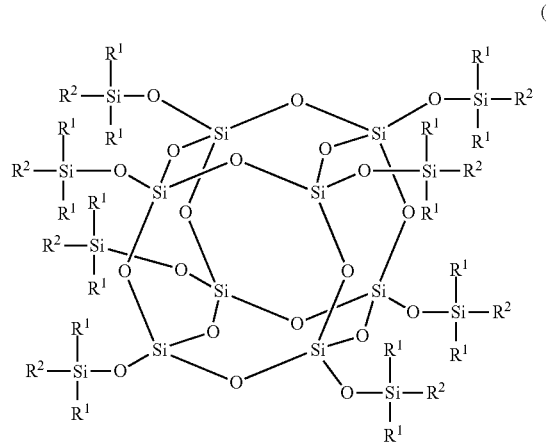
(2)

(where $R^1$ and $R^2$ are as defined above; and the molar ratio of monovalent hydrocarbon group:hydrogen in $R^2$ is the same as the above).

In the silicone resin composition of the present invention, it is preferable that the alkenyl group-containing polysiloxane is represented by formula (3) below,

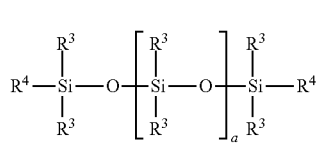
(3)

(where $R^3$ represents a monovalent hydrocarbon group selected from a saturated hydrocarbon group and an aromatic hydrocarbon group; $R^4$ represents an alkenyl group; and "a" represents an integer of 1 or more).

In the silicone resin composition of the present invention, it is preferable that the organohydrogenpolysiloxane is a side-chain type organohydrogenpolysiloxane represented by formula (5) below;

(5)

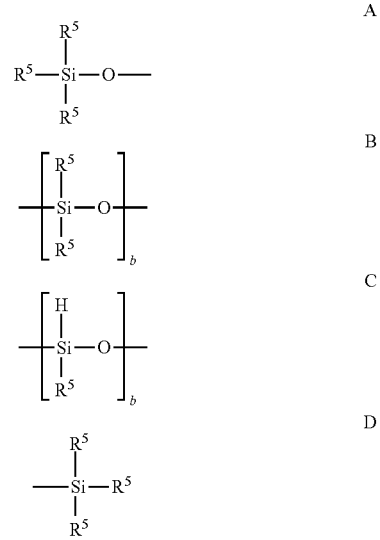

(where A to D represent constituent units; A and D represent terminal units; B and C represent repeating units; $R^5$ represents a monovalent hydrocarbon group selected from a saturated hydrocarbon group and an aromatic hydrocarbon group; "b" represents 0 or an integer of 1 or more; and "c" represents an integer of 1 or more)
and/or,
a both-ends type organohydrogenpolysiloxane represented by formula (6) below, (6)

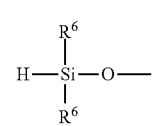
E

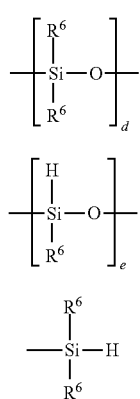

(where E to H represent constituent units; E and H represent terminal units; F and G represent repeating units; $R^6$ represents a monovalent hydrocarbon group selected from a saturated hydrocarbon group and an aromatic hydrocarbon group; "d" represents an integer of 0 or more; and "e" represents an integer of 0 or more).

It is preferable that the silicone resin composition of the present invention contains a silicone resin precursor obtained by allowing the cage octasilsesquioxane and the alkenyl group-containing polysiloxane to react in the presence of the hydrosilylation catalyst; and the organohydrogenpolysiloxane.

An encapsulating layer of the present invention is an encapsulating layer used for encapsulating an optical semiconductor element, wherein the encapsulating layer is formed from a silicone resin composition, and the silicone resin composition contains a cage octasilsesquioxane having a group represented by formula (1) below, an alkenyl group-containing polysiloxane containing an alkenyl group having the number of moles smaller than the number of moles of the hydrosilyl group of the cage octasilsesquioxane, a hydrosilylation catalyst, and organohydrogenpolysiloxane,

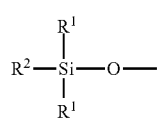

(where $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

An optical semiconductor device of the present invention includes an optical semiconductor element and an encapsulating layer that encapsulates the optical semiconductor element, wherein the encapsulating layer is formed from a silicone resin composition, and the silicone resin composition contains a cage octasilsesquioxane having a group represented by formula (1) below, an alkenyl group-containing polysiloxane containing an alkenyl group having the number of moles smaller than the number of moles of the hydrosilyl group of the cage octasilsesquioxane, a hydrosilylation catalyst, and organohydrogenpolysiloxane,

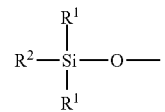

(where $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; the molar ratio of monovalent hydrocarbon group:hydrogen in $R^2$ in the cage octasilsesquioxane as a whole is, as an average value, in a range of 6.5:1.5 to 5.5:2.5).

A reflector of the present invention is a reflector used for reflecting light emitted from an optical semiconductor element, wherein the reflector is formed from a light reflective composition containing a silicone resin composition and a light reflective component, and the silicone resin composition contains a cage octasilsesquioxane having a group represented by formula (1) below, an alkenyl group-containing polysiloxane containing an alkenyl group having the number of moles smaller than the number of moles of the hydrosilyl group of the cage octasilsesquioxane, a hydrosilylation catalyst, and organohydrogenpolysiloxane,

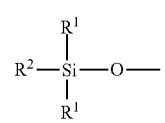

(where $R^1$ represents a monovalent hydrocarbon group selected from a saturated hydrocarbon group and an aromatic hydrocarbon group; $R^2$ represents hydrogen or a monovalent hydrocarbon group selected from a saturated hydrocarbon group and an aromatic hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

An optical semiconductor device of the present invention includes an optical semiconductor element and a reflector that reflects light emitted from the optical semiconductor element, wherein the reflector is formed from a light reflective composition containing a silicone resin composition and a light reflective component, and the silicone resin composition contains a cage octasilsesquioxane having a group represented by formula (1) below, an alkenyl group-containing polysiloxane containing an alkenyl group having the number of moles smaller than the number of moles of the hydrosilyl group of the cage octasilsesquioxane, a hydrosilylation catalyst, and organohydrogenpolysiloxane,

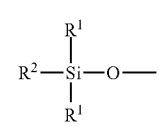

(where R¹ represents a monovalent hydrocarbon group selected from a saturated hydrocarbon group and an aromatic hydrocarbon group; R² represents hydrogen or a monovalent hydrocarbon group selected from a saturated hydrocarbon group and an aromatic hydrocarbon group; and the molar ratio of monovalent hydrocarbon group:hydrogen in R² in the cage octasilsesquioxane as a whole is, as an average value, in a range of 6.5:1.5 to 5.5:2.5).

The silicone resin composition of the present invention in the second invention group has a molar ratio of monovalent hydrocarbon group:hydrogen in R² in a specific range, and therefore in the cage octasilsesquioxane, the proportion of the hydrosilyl group to be reacted with the alkenyl group of the alkenyl group-containing polysiloxane is adjusted. Moreover, the alkenyl group-containing polysiloxane is allowed to react with the cage octasilsesquioxane so that the number of moles of the alkenyl group is smaller than the number of moles of the hydrosilyl group of the cage octasilsesquioxane. Therefore, the obtained silicone resin composition has excellent transparency and heat resistance, and can have both thermoplastic and thermosetting properties.

Furthermore, the silicone resin composition contains organohydrogenpolysiloxane, and therefore the hydrosilyl group in the organohydrogenpolysiloxane can be allowed to react with the residual hydrosilyl group in the cage octasilsesquioxane, thereby allowing improvement in flexibility of the silicone resin composition.

Furthermore, the silicone resin composition achieves a decreased thermosetting temperature.

Thus, the encapsulating layer of the present invention composed of the above-described silicone resin composition in the second invention group is plasticized by heating at the time of encapsulation, and thereafter is cured at low temperature, thereby allowing encapsulation of the optical semiconductor element while preventing damages effectively.

In the optical semiconductor device of the present invention in the second invention group, the optical semiconductor element is encapsulated by the above-described encapsulating layer, and therefore has excellent optical properties and heat resistance, and also has excellent reliability, mechanical strength, and durability.

The reflector of the present invention containing the above-described silicone resin composition in the second invention group has excellent heat resistance, flexibility, thermoplastic properties, and thermosetting properties.

The optical semiconductor device of the present invention including the above-described reflector in the second invention group has excellent optical properties and heat resistance, and also has excellent flexibility, mechanical strength, and durability.

The third invention group is as follows.

A silicone resin composition of the present invention contains a cage octasilsesquioxane having a group represented by formula (1) below; a straight chain polysiloxane containing alkenyl groups at both ends which contains, at both of its molecular ends, an alkenyl group having the number of moles smaller than the number of moles of the hydrosilyl group of the cage octasilsesquioxane; a hydrosilylation catalyst; and a polysiloxane containing alkenyl groups at side chain which contains two or more alkenyl groups at its side chain,

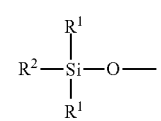

(1)

(where R¹ represents a monovalent hydrocarbon group; R² represents hydrogen or a monovalent hydrocarbon group; and the molar ratio of monovalent hydrocarbon group:hydrogen in R² in the cage octasilsesquioxane as a whole is, as an average value, in a range of 6.5:1.5 to 5.5:2.5).

In the silicone resin composition of the present invention, it is preferable that the cage octasilsesquioxane is represented by formula (2) below,

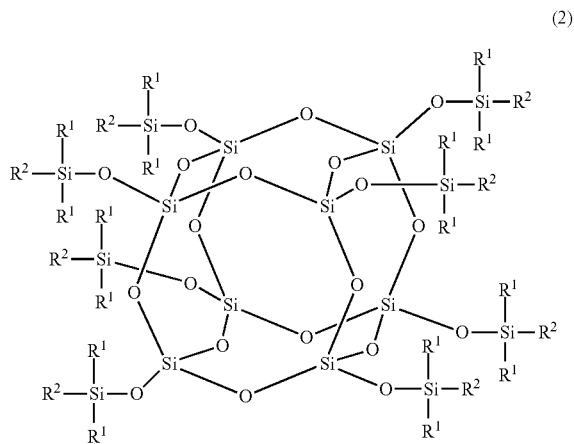

(2)

(where R¹ and R² are as defined above, and the molar ratio of monovalent hydrocarbon group:hydrogen in R² is the same as above).

In the silicone resin composition of the present invention, it is preferable that the polysiloxane containing alkenyl groups at both ends is represented by formula (3) below:

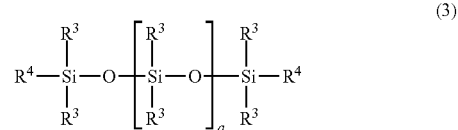

(3)

(where R³ represents a monovalent hydrocarbon group; R⁴ represents an alkenyl group; and "a" represents an integer of 1 or more).

In the silicone resin composition of the present invention, it is preferable that the polysiloxane containing alkenyl groups at side chain is represented by formula (8) below, (8)

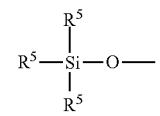

A

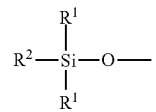

(1)

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

An optical semiconductor device of the present invention includes an optical semiconductor element and an encapsulating layer that encapsulates the optical semiconductor element, wherein the encapsulating layer is formed from a silicone resin composition, and the silicone resin composition contains a cage octasilsesquioxane having a group represented by formula (1) below; a straight chain polysiloxane containing alkenyl groups at both ends which contains, at both of its molecular ends, an alkenyl group having the number of moles smaller than the number of moles of the hydrosilyl group of the cage octasilsesquioxane; a hydrosilylation catalyst; and a polysiloxane containing alkenyl groups at side chain which contains two or more alkenyl groups at its side chain,

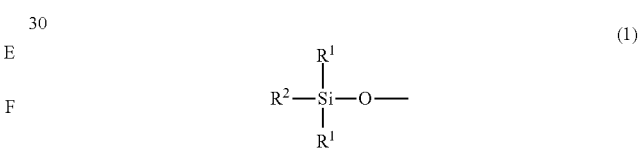

(1)

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

A reflector of the present invention is a reflector used for reflecting light emitted from an optical semiconductor element, wherein the reflector is formed from a light reflective composition containing a silicone resin composition and a light reflective component, and the silicone resin composition contains a cage octasilsesquioxane having a group represented by formula (1) below; a straight chain polysiloxane containing alkenyl groups at both ends which contains, at both of its molecular ends, an alkenyl group having the number of moles smaller than the number of moles of the hydrosilyl group of the cage octasilsesquioxane; a hydrosilylation catalyst; and a polysiloxane containing alkenyl groups at side chain which contains two or more alkenyl groups at its side chain,

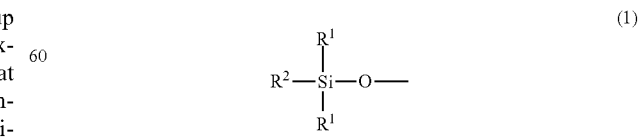

(1)

(where $R^1$ represents a monovalent hydrocarbon group; $R^2$ represents hydrogen or a monovalent hydrocarbon group; and the molar ratio of monovalent hydrocarbon group:hydrogen

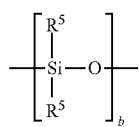

B

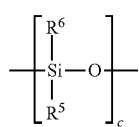

C

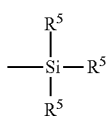

D (where A to D represent constituent units; A and D represent terminal units; B and C represent repeating units; $R^5$ represents a monovalent hydrocarbon group; $R^6$ represents an alkenyl group; "b" represents 0 or an integer of 1 or more; and "c" represents an integer of 2 or more).

In the silicone resin composition of the present invention, it is preferable that the polysiloxane containing alkenyl groups at side chain is represented by formula (9) below,

 E

 F

 G

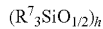 H (where E to H represent constituent units; E to G represent repeating units; H represents a terminal unit; $R^7$ represents a monovalent hydrocarbon group; "e" represents an integer of 1 or more; "f" and "g" represent 0 or an integer of 1 or more; "h" represents an integer of 4 or more; and at least two $R^7$ groups are alkenyl groups per 1 molecule).

It is preferable that the silicone resin composition of the present invention contains a silicone resin precursor obtained by allowing the cage octasilsesquioxane to react with the polysiloxane containing alkenyl groups at both ends in the presence of the hydrosilylation catalyst; and the polysiloxane containing alkenyl groups at side chain.

An encapsulating layer of the present invention is an encapsulating layer used for encapsulating an optical semiconductor element, wherein the encapsulating layer is formed from a silicone resin composition, and the silicone resin composition contains a cage octasilsesquioxane having a group represented by formula (1) below; a straight chain polysiloxane containing alkenyl groups at both ends which contains, at both of its molecular ends an alkenyl group having the number of moles smaller than the number of moles of the hydrosilyl group of the cage octasilsesquioxane; a hydrosilylation catalyst; and a polysiloxane containing alkenyl groups at side chain which contains two or more alkenyl groups at its side chain, in $R^2$ in the cage octasilsesquioxane as a whole is, as an average value, in a range of 6.5:1.5 to 5.5:2.5).

An optical semiconductor device of the present invention includes an optical semiconductor element and a reflector that reflects light emitted from the optical semiconductor element, wherein the reflector is formed from a light reflective composition containing a silicone resin composition and a light reflective component, and the silicone resin composition contains a cage octasilsesquioxane having a group represented by formula (1) below; a straight chain polysiloxane containing alkenyl groups at both ends which contains, at both of its molecular ends, an alkenyl group having the number of moles smaller than the number of moles of the hydrosilyl group of the cage octasilsesquioxane; a hydrosilylation catalyst; and a polysiloxane containing alkenyl groups at side chain which contains two or more alkenyl groups at its side chain,

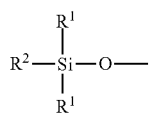
(1)

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

The silicone resin composition of the present invention in the third invention group has a molar ratio of monovalent hydrocarbon group:hydrogen in $R^2$ in a specific range, and therefore in the cage octasilsesquioxane, the proportion of the hydrosilyl group to be reacted with the alkenyl group of the polysiloxane containing alkenyl groups at both ends is adjusted. Moreover, the polysiloxane containing alkenyl groups at both ends is allowed to react with the cage octasilsesquioxane so that the number of moles of the alkenyl group is smaller than the number of moles of the hydrosilyl group of the cage octasilsesquioxane. Therefore, the obtained silicone resin composition has excellent transparency and heat resistance, and can have both thermoplastic and thermosetting properties.

Furthermore, the silicone resin composition contains a polysiloxane containing alkenyl groups at side chain, and therefore the alkenyl group of the polysiloxane containing alkenyl groups at side chain is allowed to react with the residual hydrosilyl group in the cage octasilsesquioxane, thereby allowing improvement in flexibility of the silicone resin composition.

Furthermore, the silicone resin composition achieves a decreased thermosetting temperature.

Thus, the encapsulating layer of the present invention formed from the above-described silicone resin composition in the third invention group is allowed to plasticize by heating at the time of encapsulation, and thereafter is cured at low temperature, thereby allowing encapsulation of the optical semiconductor element while preventing damages effectively.

In the optical semiconductor device of the present invention in the third invention group, the optical semiconductor element is encapsulated by the above-described encapsulating layer, and therefore has excellent optical properties and heat resistance, and also has excellent reliability, mechanical strength, and durability.

The reflector of the present invention formed from the light reflective composition containing the above-described silicone resin composition in the third invention group has excellent heat resistance, flexibility, thermoplastic properties, and thermosetting properties.

Thus, the optical semiconductor device of the present invention including the above-described reflector in the third invention group has excellent optical properties and heat resistance, and also has excellent flexibility, mechanical strength, and durability.

BRIEF DESCRIPTION OF THE DRAWINGS

FIG. 1 shows a cross-sectional view of an optical semiconductor device in an embodiment of the present invention.

DETAILED DESCRIPTION OF THE INVENTION

In the following, the first embodiment to the third embodiment corresponding to the first to third invention groups, which are related to each other, are described in sequence respectively.

First Embodiment

A silicone resin composition of the present invention contains a cage octasilsesquioxane, an alkenyl group-containing polysiloxane, a hydrosilylation catalyst, and a hydroxyl group-containing polysiloxane.

The cage octasilsesquioxane is an octamer of trifunctional silicone monomer, and to be specific, has eight of the group represented by formula (1) below,

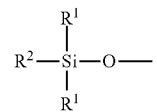
(1)

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

To be more specific, the cage octasilsesquioxane is represented by formula (2) below:

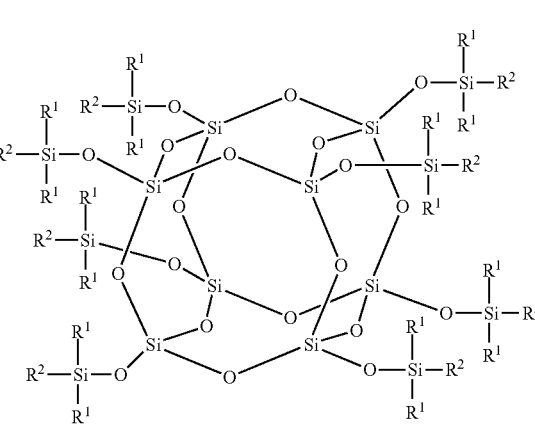
(2)

(where $R^1$ and $R^2$ are as defined above and the molar ratio of monovalent hydrocarbon group:hydrogen in $R^2$ is as defined above).

In the above-described formulas (1) and (2), a monovalent hydrocarbon group represented by $R^1$ is, for example, a saturated hydrocarbon group or an aromatic hydrocarbon group.

Examples of saturated hydrocarbon groups include straight chain saturated hydrocarbon groups (e.g., an alkyl group having 1 to 6 carbon atoms such as methyl, ethyl, propyl, butyl, pentyl, and hexyl), branched saturated hydrocarbon groups (e.g., an alkyl group having 3 to 6 carbon atoms such as isopropyl and isobutyl), and cyclic saturated hydrocarbon groups (e.g., a cycloalkyl group having 3 to 6 carbon atoms such as cyclohexyl). Examples of aromatic hydrocarbon groups include an aryl group having 6 to 8 carbon atoms such as phenyl, benzyl, and toluoyl.

The number of carbon atoms in the monovalent hydrocarbon group is, for example, 1 to 8, preferably 1 to 6.

$R^1$ may be the same or different. Preferably, $R^1$ is the same.

Preferably, in view of easy preparation and thermal stability, a straight chain saturated hydrocarbon group, more preferably an alkyl group having 1 to 6 carbon atoms, and particularly preferably methyl is used as the monovalent hydrocarbon group.

In the above-described formulas (1) and (2), examples of a monovalent hydrocarbon group represented by $R^2$ include the above-described monovalent hydrocarbon group represented by $R^1$. Preferably, methyl is used.

The molar ratio of monovalent hydrocarbon group:hydrogen in $R^2$ in formula (2) is, in the cage octasilsesquioxane as a whole, in the range of 6.5:1.5 to 5.5:2.5, preferably 6.0:2.0 to 5.5:2.5 as an average value.

That is, in one molecule of the cage octasilsesquioxane, the group represented by the above-described formula (1) forms 1.5 to 2.5 (to be specific, two), preferably 2 to 2.5 (to be specific, two) of hydrosilyl groups (—SiH).

When the above-described molar ratio of monovalent hydrocarbon group:hydrogen in $R^2$ is more than 6.5/1.5 (=6.5:1.5) (for example, when the molar ratio of monovalent hydrocarbon group:hydrogen in $R^2$ is 7/1 (=7:1)), the number of moles of the hydrosilyl group is significantly small, and therefore the reaction degree of the cage octasilsesquioxane relative to the alkenyl group-containing polysiloxane and/or the hydroxyl group-containing polysiloxane is decreased significantly, causing a low molecular weight of the obtained silicone resin composition, and a solid silicone resin composition cannot be obtained.

On the other hand, when the above-described molar ratio of monovalent hydrocarbon group:hydrogen in $R^2$ is below 5.5/2.5 (=5.5:2.5) (for example, when the molar ratio of monovalent hydrocarbon group:hydrogen in $R^2$ is 5/3 (=5:3)), the number of moles of the hydrosilyl group of the cage octasilsesquioxane is excessively high, and therefore the reaction degree of the cage octasilsesquioxane relative to the alkenyl group-containing polysiloxane and/or the hydroxyl group-containing polysiloxane is excessively increased, and the silicone resin composition does not exhibit thermoplastic properties.

Examples of the above-described cage octasilsesquioxane include, to be specific, a cage octasilsesquioxane having methyl in $R^1$ and methyl or hydrogen in $R^2$ in the above-described formulas (1) and (2), and having a molar ratio of methyl:hydrogen in $R^2$ in the cage octasilsesquioxane as a whole, as an average value, of 5.5:2.5, 6:2, or 6.5:1.5.

The cage octasilsesquioxane represented by the above-described formula (2) is synthesized, for example, by a known method (in accordance with e.g., Japanese Unexamined Patent Publication No. 2007-246880).

To be specific, tetraalkoxysilane (tetraethoxysilane, etc.) is allowed to react with alcohol such as methanol and/or water in the presence of a catalyst to synthesize an octa (silsesquioxane) skeleton (portion excluding formula (1) in formula (2)), and thereafter, dialkylchlorosilane (dimethylchlorosilane, etc.) and trialkylchlorosilane (trimethylchlorosilane, etc.) are blended at the mixing ratio corresponding to the above-described molar ratio of monovalent hydrocarbon group:hydrogen in $R^2$, allowing the alkoxyl group (ethoxy, etc.) bonded to the silicon atom in the octa (silsesquioxane) skeleton to react with dialkylchlorosilane and trialkylchlorosilane. After the reaction, as necessary, the reactant is purified. The cage octasilsesquioxane can be obtained in this manner.

A commercially available product can also be used as the cage octasilsesquioxane.

The alkenyl group-containing polysiloxane is a polysiloxane containing an alkenyl group, for example, a straight chain polysiloxane containing alkenyl groups at both of its molecular ends (polysiloxane containing alkenyl groups at both ends), and to be specific, is represented by formula (3) below,

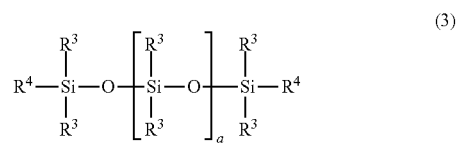

(where $R^3$ represents a monovalent hydrocarbon group; $R^4$ represents an alkenyl group; and "a" represents an integer of 1 or more).

The monovalent hydrocarbon group represented by $R^3$ in formula (3) may be the same or different, and preferably the same.

Examples of the monovalent hydrocarbon group represented by $R^3$ include the above-described examples of the monovalent hydrocarbon group represented by $R^1$ in formulas (1) and (2). Preferable examples are methyl and phenyl, and a more preferable example is methyl.

Examples of the alkenyl group represented by $R^4$ in formula (3) include substituted or unsubstituted alkenyl group. A preferable example is an unsubstituted alkenyl group.

An example of such an alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^4$ may be the same or different. Preferably, $R^4$ is the same.

Examples of the alkenyl group is, preferably, in view of reactivity of the cage octasilsesquioxane with the hydrosilyl group, an alkenyl group having 2 to 5 carbon atoms, and more preferably vinyl.

In view of reactivity and stability, "a" is preferably an integer of 1 to 5000, more preferably an integer of 1 to 1000. Also, in view of reactivity and stability, "a" is preferably, an integer of 1 to 100, more preferably an integer of 1 to 50.

The number average molecular weight of the alkenyl group-containing polysiloxane represented by the above-described formula (3) is, in view of safety and handleability, for example, 100 to 10000, preferably 300 to 5000. Also, the number average molecular weight of the alkenyl group-containing polysiloxane represented by the above-described formula (3) is, in view of stability and handleability, for example, 100 to 8000, preferably 300 to 5000. The number average molecular weight is determined by gel permeation chromatography (GPC: calibrated with polystyrene standards).

The alkenyl group-containing polysiloxane represented by the above-described formula (3) is synthesized in accordance with, for example, a known method. Alternatively, a commercially available product (e.g., manufactured by Gelest, Inc.) can also be used.

Examples of the hydrosilylation catalyst include platinum catalysts such as platinum black, platinum chloride, chloroplatinic acid, a platinum olefin complex, a platinum carbonyl complex, and platinum acetyl acetate; palladium catalysts; and rhodium catalysts.

Of these hydrosilylation catalysts, preferably, in view of compatibility and transparency, a platinum catalyst, more preferably a platinum olefin complex, to be specific, a platinum-divinylsiloxane complex such as a platinum-1,3-divinyl-1,1,3,3-tetramethyldisiloxane complex is used.

The hydrosilylation catalyst may be prepared as a solution in a known solvent (such as toluene).

The hydroxyl group-containing polysiloxane is, for example, a polysiloxane containing a plurality of (e.g., two) hydroxyl groups, to be more specific, a both-ends polysiloxane which contains hydroxyl groups at both ends of its molecule. To be specific, the hydroxyl group-containing polysiloxane is represented by formula (4) below,

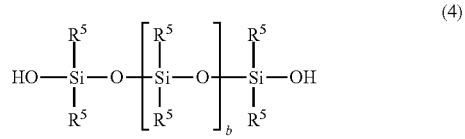

(4)

(where $R^5$ represents a monovalent hydrocarbon group and "b" represents an integer of 1 or more).

The monovalent hydrocarbon group represented by $R^5$ in formula (4) may be the same or different, and preferably the same.

Examples of the monovalent hydrocarbon group represented by $R^5$ include the above-described examples of the monovalent hydrocarbon group represented by $R^1$ in formulas (1) and (2). Preferable examples are methyl and phenyl, and a more preferable example is methyl.

In view of reactivity and stability, "b" is preferably an integer of 1 to 10000, more preferably an integer of 1 to 5000, and in view of obtaining a silicone resin composition that is solid at room temperature, while imparting flexibility, particularly preferably, "b" represents an integer larger than that of "a", and most preferably, "b" represents an integer of 100 to 3000.

The number average molecular weight of the hydroxyl group-containing polysiloxane represented by the above-described formula (4) is, in view of safety and handleability, for example, 100 to 100000, preferably 500 to 50000. The number average molecular weight is determined by gel permeation chromatography (GPC: calibrated with polystyrene standards).

The hydroxyl group-containing polysiloxane represented by the above-described formula (4) is synthesized in accordance with, for example, a known method. Alternatively, a commercially available product (e.g., manufactured by Gelest, Inc.) can also be used.

The silicone resin composition of the present invention is prepared by blending cage octasilsesquioxane, an alkenyl group-containing polysiloxane, a hydrosilylation catalyst, and a hydroxyl group-containing polysiloxane.

The mixing ratio of the cage octasilsesquioxane relative to the silicone resin composition is, for example, 10 to 80 mass %, preferably 10 to 70 mass %.

The mixing ratio of the alkenyl group-containing polysiloxane is prepared so that the number of moles of the alkenyl group of the alkenyl group-containing polysiloxane is smaller than the number of moles of the hydrosilyl group of the cage octasilsesquioxane.

That is, the molar ratio of the alkenyl group to the hydrosilyl group (number of moles of the alkenyl group/number of moles of the hydrosilyl group) is below 1, for example, 0.10 to 0.99, preferably 0.20 to 0.99, more preferably 0.50 to 0.99.

When the above-described molar ratio is more than the above-described range, the hydrosilyl group becomes fewer than the alkenyl group, and in such a case, after the reaction, surplus hydrosilyl groups do not remain sufficiently, and thermosetting properties cannot be imparted to the silicone resin composition.

On the other hand, when the above-described molar ratio is below the above-described range, hydrosilyl groups may remain excessively, and cage octasilsesquioxanes may be cured by hydrolysis between each other due to moisture in the air and by self-condensation, thus, flexibility may not be achieved.

The mixing ratio of the hydrosilylation catalyst (solid content) relative to 100 parts by mass of the total amount of cage octasilsesquioxane and alkenyl group-containing polysiloxane is, for example, $1.0 \times 10^{-10}$ to 3 parts by mass, or preferably $1.0 \times 10^{-8}$ to 1 part by mass.

The mixing ratio of the hydroxyl group-containing polysiloxane is adjusted so that the molar ratio (X/Y) (number of moles (X) of the hydroxyl group relative to the number of moles (Y) subtracting the number of moles of the alkenyl group of the alkenyl group-containing polysiloxane from the number of moles of the hydrosilyl group of the cage octasilsesquioxane) is, for example, 0.001 to 1000, preferably 0.01 to 100. In other words, the mixing ratio of the hydroxyl group-containing polysiloxane relative to 100 parts by mass of the total of the cage octasilsesquioxane and the alkenyl group-containing polysiloxane is, for example, 0.1 to 50 parts by mass, preferably 1 to 30 parts by mass.

To prepare the silicone resin composition, preferably, a silicone resin precursor obtained by allowing the cage octasilsesquioxane and the alkenyl group-containing polysiloxane to react in the presence of a hydrosilylation catalyst, and a hydroxyl group-containing polysiloxane are blended.

That is, first, a cage octasilsesquioxane is allowed to react with the alkenyl group-containing polysiloxane in the presence of a hydrosilylation catalyst so that the number of moles of the hydrosilyl group of the cage octasilsesquioxane is larger (in excess) than the number of moles of the alkenyl group of the alkenyl group-containing polysiloxane, thereby producing a silicone resin precursor.

To obtain the silicone resin precursor, to be more specific, the above-described cage octasilsesquioxane and the alkenyl group-containing polysiloxane are blended at the above-described mixing ratio along with a hydrosilylation catalyst, and as necessary, a solvent, and thereafter, as necessary, the mixture is heated.

Examples of solvents include aromatic hydrocarbons such as toluene, aliphatic hydrocarbons such as hexane, and esters such as ethyl acetate. Preferably, in view of improving compatibility between the components, aromatic hydrocarbon is used, more preferably toluene is used.

The reaction temperature is, for example, 0 to 100° C., or preferably 20 to 80° C., and the reaction time is, for example, 0.5 to 96 hours.

In this manner, cage octasilsesquioxane is allowed to react with the alkenyl group-containing polysiloxane. That is, the hydrosilyl group of the cage octasilsesquioxane and the alkenyl group of the alkenyl group-containing polysiloxane undergo hydrosilylation reaction.

The degree of hydrosilylation reaction between the hydrosilyl group of the cage octasilsesquioxane and the alkenyl group of the alkenyl group-containing polysiloxane can be checked by $^1$H-NMR measurement based on the signal intensity of the alkenyl group of the alkenyl group-containing polysiloxane, and the hydrosilylation reaction is regarded as terminated when the signal disappeared.

In the above-described hydrosilylation reaction, cage octasilsesquioxane is allowed to react with the alkenyl group-containing polysiloxane so that the number of moles of the hydrosilyl group is in excess compared with the number of moles of the alkenyl group, and after the reaction, the excess portion of the hydrosilyl group remains.

The silicone resin precursor is obtained in this manner.

The silicone resin precursor is liquid or semi-solid.

Then, the obtained silicone resin precursor and the hydroxyl group-containing polysiloxane are blended at the above-described ratio. By heating (described later) thereafter, the silicone resin precursor is allowed to react with the hydroxyl group-containing polysiloxane. As necessary, the solvent was distilled off.

The silicone resin composition of the present invention can be obtained in this manner.

To the silicone resin composition, additives such as the following can be added at an appropriate proportion to the extent that does not damage the excellent effects of the present invention: for example, antioxidants, modifiers, surfactants, dyes, pigments, discoloration inhibitors, ultraviolet absorbers, fillers, and phosphors.

The obtained silicone resin composition is solid. Due to steric hindrance of the cage octasilsesquioxane, the mobility of the alkenyl group-containing polysiloxane is reduced, and therefore a silicone resin composition in solid state can be obtained.

In the silicone resin composition of the present invention, the molar ratio of monovalent hydrocarbon group:hydrogen in $R^2$ is in a specific range, and therefore in the cage octasilsesquioxane, the proportion of the hydrosilyl group to be reacted with the alkenyl group of the alkenyl group-containing polysiloxane is adjusted. Moreover, the alkenyl group-containing polysiloxane is allowed to react with cage octasilsesquioxane so that the alkenyl group thereof has the number of moles that is smaller than the number of moles of the hydrosilyl group of the cage octasilsesquioxane. Therefore, the obtained silicone resin composition has excellent transparency and heat resistance, and at the same time, can have both thermoplastic and thermosetting properties.

That is, the silicone resin composition is once plasticized (or liquefied) by the above-described heating, and thereafter, cured by heat.

Thermoplastic properties of the silicone resin composition are exhibited when the cage octasilsesquioxane and the alkenyl group-containing polysiloxane are heated and their mobility is increased.

The thermoplastic temperature of the silicone resin composition is, for example, 40 to 150° C., preferably 50 to 100° C. The thermoplastic temperature is a temperature at which the silicone resin composition exhibits thermoplastic properties, to be specific, a temperature at which a solid silicone resin composition is softened by heating and becomes liquid completely, and is substantially the same as the softening temperature.

The once plasticized silicone resin composition exhibits thermosetting properties, to be specific, by reaction between the hydrosilyl group remaining in the silicone resin precursor and the hydroxyl group in the hydroxyl group-containing polysiloxane.

To be more specific, the hydrosilyl group of the cage octasilsesquioxane in the silicone resin precursor undergoes condensation reaction with the hydroxyl group of the hydroxyl group-containing polysiloxane.

The thermosetting temperature of the silicone resin composition is relatively low, for example, 100 to 250° C., preferably 120 to 250° C. The thermosetting temperature is a temperature at which the silicone resin composition exhibits thermosetting properties, to be specific, a temperature at which the plasticized silicone resin composition is cured by heating and becomes solid completely.

The silicone resin composition contains a hydroxyl group-containing polysiloxane, and therefore the hydroxyl group of the hydroxyl group-containing polysiloxane is allowed to react with the residual hydrosilyl group in the cage octasilsesquioxane, and such reaction allows crosslinking to the cage octasilsesquioxane. Therefore, improvement in flexibility of the silicone resin composition can be achieved.

Furthermore, the silicone resin composition achieves a decreased thermosetting temperature (e.g., 100 to 250° C.).

In the above-described embodiment, first, the silicone resin precursor is obtained, and thereafter, the silicone resin precursor and the hydroxyl group-containing polysiloxane are blended, thereby preparing a silicone resin composition, but the preparation method of the silicone resin composition is not limited thereto. The silicone resin composition can also be prepared by, for example, by blending at once cage octasilsesquioxane, an alkenyl group-containing polysiloxane, a hydrosilylation catalyst, and a hydroxyl group-containing polysiloxane, and as necessary, heating the mixture.

The silicone resin composition can be used, without limitation, for example, as an encapsulating material and a filler material for various industrial products. The silicone resin composition can be formed, preferably, as an encapsulating layer for various industrial products, to be specific, as an encapsulating layer for encapsulating an optical semiconductor element.

The optical semiconductor element is not particularly limited, as long as the optical semiconductor element is an element provided in an optical semiconductor device, and examples thereof include a light-emitting diode (LED), a photodiode, a phototransistor, and a laser diode. A preferable example is an LED, a more preferable example is an LED for lighting.

FIG. 1 shows a cross-sectional view for illustrating an embodiment of the optical semiconductor device of the present invention.

Next, an embodiment of the optical semiconductor device of the present invention is described with reference to FIG. 1.

In FIG. 1, an optical semiconductor device 11 includes a substrate 3; an optical semiconductor element 1 mounted on the substrate 3; a housing 2 formed on the substrate 3; an encapsulating layer 7 that encapsulates the optical semiconductor element 1; and a phosphor layer 8 formed on the encapsulating layer 7.

The substrate 3 is formed into a flat plate, and is formed from, for example, a known insulating resin such as polyimide resin.

On the top face of the substrate 3, although not shown in FIG. 1, a substrate-side terminal is formed for electrically connecting with an element-side terminal of the optical semiconductor element 1.

The optical semiconductor element 1 is mounted on the substrate 3, and is formed from a known semiconductive material.

The optical semiconductor element 1 is flip-chip mounted on or wire bonded to the substrate 3 by electrically connecting the element-side terminal and the substrate-side terminal of the substrate 3.

The housing 2 is generally frame-shaped when viewed from the top, and formed into a generally trapezoid tube, with its width gradually narrowed upward. The housing 2 is disposed to be spaced apart from the optical semiconductor element 1, so as to encircle the optical semiconductor element 1.

The housing 2 is formed from a sintered compact of a ceramic material containing a light reflective component, and serves as a reflector which reflects light emitted from the optical semiconductor element 1.

The encapsulating layer 7 fills inside the housing 2, to be specific, covers the top face of the substrate 3 exposed from the optical semiconductor element 1, and the top face and side face of the optical semiconductor element 1, in the housing 2.

The encapsulating layer 7 is formed so that the top face thereof is flush with the top face of the housing 2 in the thickness direction (direction perpendicular to the surface direction).

The phosphor layer 8 is formed on the entire top face of the encapsulating layer 7. The phosphor layer 8 is formed also on the inner end portion of the top face of the housing 2.

The phosphor layer 8 is formed from, for example, a resin composition containing phosphor particles (e.g., YAG (yttrium.aluminum.garnet):Ce, etc.). The phosphor layer 8 can also be formed from a ceramic phosphor, and sintering the ceramic phosphor.

To obtain the optical semiconductor device 11, first, a substrate 3 is prepared, and then an optical semiconductor element 1 is mounted on the substrate 3: a housing 2 is formed separately on the substrate 3.

Then, the housing 2 is filled with the encapsulating layer 7. To be specific, the housing 2 is filled with the above-described silicone resin composition, and thereafter, as necessary the solvent is distilled off, and then the provided silicone resin composition is heated at the above-described temperature.

Then, the silicone resin composition is once plasticized (or liquefied) by the above-described heating, thereby encapsulating the optical semiconductor element 1, and thereafter, cured.

Thereafter, a phosphor layer 8 is formed on the encapsulating layer 7.

An optical semiconductor device 11 is obtained in this manner.

Then, because the encapsulating layer 7 is composed of the above-described silicone resin composition, by being plasticized by heating at the time of encapsulation and then being cured at low temperature, the optical semiconductor element 1 can be encapsulated while effectively preventing damages from impacts or overheating.

In the above-described optical semiconductor device 11, the optical semiconductor element 1 is encapsulated by the above-described encapsulating layer 7, and therefore has excellent optical properties and heat resistance, and also has excellent reliability, mechanical strength, and durability.

Furthermore, although in the embodiment of FIG. 1, the encapsulating layer 7 is formed from the silicone resin composition of the present invention, the housing 2 can also be formed from the silicone resin composition of the present invention.

In FIG. 1, the housing 2 as a reflector is formed from a light reflective composition containing a silicone resin composition and a light reflective component.

The light reflective component is, for example, a white compound, and examples of such a white compound include, to be specific, a white pigment.

Examples of white pigments include white inorganic pigments, and examples of such white inorganic pigments include oxides such as titanium oxide, zinc oxide, and zirconium oxide; carbonates such as white lead (lead carbonate), and calcium carbonate; and clay minerals such as kaolin (kaolinite).

The white inorganic pigment is preferably oxide, more preferably titanium oxide.

With titanium oxide, characteristics such as high whiteness, high light reflectivity, excellent hiding properties (hiding power), excellent colorability, high dispersiveness, excellent weather resistance, and high chemical stability can be obtained.

Such a titanium oxide is, to be specific, $TiO_2$ (titanium oxide (IV), titanium dioxide).

The crystal structure of titanium oxide is not particularly limited, and examples thereof include rutile, brookite, and anatase. Preferably, the crystal structure of titanium oxide is rutile.

The crystal system of the titanium oxide is not particularly limited, and examples thereof include the tetragonal system and the rhombic system. Preferably, the crystal system of the titanium oxide is the tetragonal system.

When the crystal structure and the crystal system of titanium oxide is rutile and tetragonal system, respectively, even if the housing 2 is exposed to high temperature for a long period of time, reduction in light (to be specific, visible light, in particular, light at wavelengths around 450 nm) reflectance can be prevented effectively.

The light reflective component is particulate, and its shape is not limited, including, for example, spherical, plate-like, and needle-like shapes. The average value of the maximum length of the light reflective component (when spherical, the average particle size) is, for example, 1 to 1000 nm. The average value of the maximum length of is measured by using a laser diffraction/scattering particle size distribution analyzer.

The mixing ratio of the light reflective component relative to 100 parts by mass of the silicone resin composition is, for example, 0.5 to 90 parts by mass, preferably, in view of colorability, light reflectivity, and handleability of the light reflective composition, 1.5 to 70 parts by mass.

The above-described light reflective component is dispersed and mixed homogeneously in the silicone resin composition.

The light reflective composition is prepared by blending the above-described silicone resin composition and a light reflective component, and mixing the mixture homogeneously.

The housing 2 is formed from the above-described light reflective composition by being molded into the above-described shape, and then heated. Also, the above-described silicone resin composition is contained. The housing 2 has excellent heat resistance, flexibility, thermoplastic and thermosetting properties.

Therefore, the optical semiconductor device 11 including the above-described housing 2 has excellent optical properties and heat resistance, while at the same time has excellent flexibility, mechanical strength, and durability.

Furthermore, in the optical semiconductor device 11 shown in FIG. 1, the encapsulating layer 7 is formed from the silicone resin composition, and at the same time, the housing 2 can also be formed from the light reflective composition containing the silicone resin composition.

In this embodiment, operational advantages described above can be achieved.

Second Embodiment

The silicone resin composition of the present invention contains a cage octasilsesquioxane, an alkenyl group-containing polysiloxane, a hydrosilylation catalyst, and organohydrogenpolysiloxane.

Examples of cage octasilsesquioxanes include those cage octasilsesquioxanes given as examples in the first embodiment.

When the above-described molar ratio of monovalent hydrocarbon group:hydrogen in $R^2$ in formulas (1) and (2) is more than 6.5/1.5 (=6.5:1.5) (for example, when the molar ratio of monovalent hydrocarbon group:hydrogen in $R^2$ in formulas (1) and (2) is 7/1 (=7:1)), the number of moles of the hydrosilyl group is significantly small, and therefore the reaction degree of the cage octasilsesquioxane relative to the alkenyl group-containing polysiloxane (and organohydrogenpolysiloxane) is decreased significantly, leading to a low molecular weight of the obtained silicone resin composition, and a failure to obtain a solid silicone resin composition.

On the other hand, when the above-described molar ratio of monovalent hydrocarbon group:hydrogen in $R^2$ is below 5.5/2.5 (=5.5:2.5) (for example, when the molar ratio of monovalent hydrocarbon group:hydrogen in $R^2$ is 5/3 (=5:3)), the number of moles of the hydrosilyl group of the cage octasilsesquioxane is excessively high, and therefore, the reaction degree of the cage octasilsesquioxane relative to the alkenyl group-containing polysiloxane (and organohydrogenpolysiloxane) is increased excessively, and therefore the silicone resin composition does not exhibit thermoplastic properties.

Examples of alkenyl group-containing polysiloxanes include those alkenyl group-containing polysiloxanes given as examples in the first embodiment.

Examples of hydrosilylation catalysts include those hydrosilylation catalysts given as examples in the first embodiment.

Organohydrogenpolysiloxane is a polysiloxane containing a hydrosilyl group (—SiH). To be more specific, organohydrogenpolysiloxane is a side-chain type organohydrogenpolysiloxane which has a straight chain and contains a hydrosilyl group at a side chain bonded to a main chain; and/or a both-ends type organohydrogenpolysiloxane which contains hydrosilyl groups at both of its molecular ends.

The side-chain type organohydrogenpolysiloxane is, for example, represented by formula (5) below:

(5)

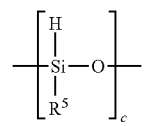

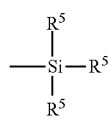

(where A to D represent constituent units, A and D represent terminal units; B and C represent repeating units; $R^5$ represents a monovalent hydrocarbon group selected from a saturated hydrocarbon group and an aromatic hydrocarbon group; "b" represents an integer of 0 or more; and "c" represents an integer of 1 or more).

A to D constitute a side-chain type organohydrogenpolysiloxane.

The monovalent hydrocarbon group represented by $R^5$ in formula (5) may be the same or different, and preferably the same.

Examples of the monovalent hydrocarbon group represented by $R^5$ include the above-described examples of the monovalent hydrocarbon group represented by $R^1$ in formulas (1) and (2). Preferable examples are methyl and phenyl, and a more preferable example is methyl.

In view of reactivity and stability, "b" is preferably an integer of 1 to 10000, more preferably an integer of 1 to 5000. "c" is preferably 2 or more, and also is, in view of reactivity and stability, preferably an integer of 1 to 10000, more preferably an integer of 1 to 1000, and in view of obtaining a silicone resin composition that is solid at room temperature, while imparting flexibility, particularly preferably, an integer larger than "a", most preferably an integer of 100 to 1000.

Examples of side-chain type organohydrogenpolysiloxanes include methylhydrogensiloxane, dimethylsiloxane-CO-methylhydrogensiloxane, ethylhydrogensiloxane, and methylhydrogensiloxane-CO-methylphenylsiloxane.

The number average molecular weight of the side-chain type organohydrogenpolysiloxane is, in view of stability and handleability, for example, 200 to 100000, preferably 200 to 80000. The number average molecular weight is determined by gel permeation chromatography (GPC: calibrated with polystyrene standards).

The both-ends type organohydrogenpolysiloxane is, for example, represented by formula (6) below, (6)

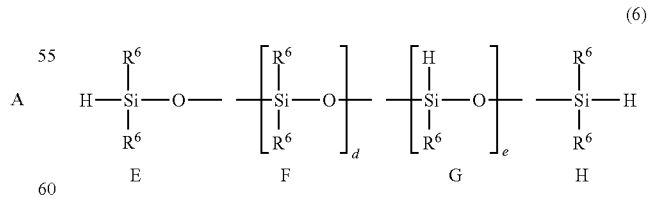

(where E to H represent constituent units; E and H represent terminal units; F and G represent repeating units; $R^6$ represents a monovalent hydrocarbon group selected from a saturated hydrocarbon group and an aromatic hydrocarbon group; "d" represents an integer of 0 or more; and "e" represents an integer of 0 or more).

E to H constitute a both-ends type organohydrogenpolysiloxane.

The monovalent hydrocarbon group represented by $R^6$ in formula (6) may be the same or different, and preferably the same.

Examples of the monovalent hydrocarbon group represented by $R^6$ include the above-described examples of the monovalent hydrocarbon group represented by $R^1$ in formulas (1) and (2). Preferable examples of monovalent hydrocarbon groups are a methyl group, a phenyl group, and a more preferable is a methyl group.

In view of reactivity and stability, "d" is, preferably, an integer of 0 or more, more preferably an integer of 1 to 10000, particularly preferably an integer of 1 to 5000.

In view of reactivity and stability, "e" is preferably, an integer of 0 or more, more preferably an integer of 1 to 10000, particularly preferably an integer of 1 to 5000.

The both-ends type organohydrogenpolysiloxane is, for example, when "e" is 1 or more, a hydrogen side chain-both ends coexisting organopolysiloxane which contains hydrogen atoms at its side chain branched from the main chain and at both ends of the main chain; to be specific, examples thereof include hydrosilyl group-terminated (both ends) methylhydrogenpolysiloxane, hydrosilyl group-terminated (both ends) (dimethylpolysiloxane-co-methylhydrogenpolysiloxane), hydrosilyl group-terminated (both ends) ethylhydrogenpolysiloxane, and hydrosilyl group-terminated (both ends) (methylhydrogenpolysiloxane-co-methylphenylpolysiloxane).

The both-ends type organohydrogenpolysiloxane is, for example, when "e" is 0, a non-side chain hydrogen/hydrogen-terminated (both ends) organopolysiloxane which does not contain hydrogen atoms at its side chain branched from the main chain but contains hydrogen atoms at both ends of the main chain; to be specific, examples thereof include hydrosilyl group-terminated (both ends) polydimethylsiloxane, hydrosilyl group-terminated (both ends) polymethylphenylsiloxane, and hydrosilyl group-terminated (both ends) polydiphenylsiloxane.

Examples of both-ends type organohydrogenpolysiloxanes include, preferably, a non-side chain hydrogen/hydrogen-terminated (both ends) organopolysiloxane represented by formula (7):

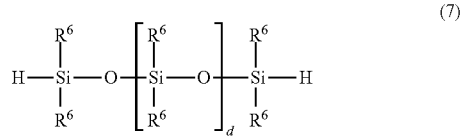

(7)

(where $R^6$ represents a monovalent hydrocarbon group selected from a saturated hydrocarbon group and an aromatic hydrocarbon group; and "d" represents an integer of 1 or more).

In formula (7), $R^6$ is as defined above, and "d" is an integer of 1 to 10000, preferably an integer of 1 to 5000.

The number average molecular weight of the both-ends type organohydrogenpolysiloxane is, in view of stability and/or handleability, for example, 100 to 1,000,000, more preferably 100 to 100,000. The number average molecular weight is determined by gel permeation chromatography (GPC: calibrated with polystyrene standards).

Such organo hydrogen siloxanes may be used singly, or can be used in combination.

The viscosity (25° C.) of organo hydrogen siloxane is, for example, 10 to 100,000 mPa·s, preferably 20 to 50,000 mPa·s. The viscosity can be measured by using a type B viscometer.

In organohydrogenpolysiloxane, the hydrosilyl group content is, to be specific, for example, 0.01 to 20 mmol/g, preferably 0.05 to 15 mmol/g. The hydrosilyl group content is calculated from the integrated values of the hydrosilyl group and the methyl group using $^1$H-NMR.

Organohydrogenpolysiloxane is synthesized in accordance with, for example, a known method. Alternatively, a commercially available product (e.g., manufactured by Gelest, Inc., Shin-Etsu Chemical Co., Ltd.) can also be used.

The silicone resin composition of the present invention is prepared by blending a cage octasilsesquioxane, an alkenyl group-containing polysiloxane, a hydrosilylation catalyst, and organohydrogenpolysiloxane.

The mixing ratio of the cage octasilsesquioxane relative to the silicone resin composition is, for example, 10 to 80 mass %, preferably 10 to 70 mass %.

The mixing ratio of the alkenyl group-containing polysiloxane is adjusted so that the number of moles of the alkenyl group of the alkenyl group-containing polysiloxane is smaller than the number of moles of the hydrosilyl group of the cage octasilsesquioxane.

That is, the molar ratio of the alkenyl group to the hydrosilyl group (number of moles of the alkenyl group/number of moles of the hydrosilyl group) is below 1, for example, 0.10 to 0.99, preferably 0.20 to 0.99, more preferably 0.50 to 0.99.

When the above-described molar ratio is more than the above-described range, the hydrosilyl group is fewer than the alkenyl group, and in such a case, after the reaction, surplus hydrosilyl groups do not remain sufficiently, and thermosetting properties cannot be imparted to the silicone resin composition.

On the other hand, when the above-described molar ratio is below the above-described range, hydrosilyl groups may remain excessively, and cage octasilsesquioxanes may be cured by hydrolysis between each other due to moisture in the air and by self-condensation, thus, flexibility may not be achieved.

The mixing ratio of the hydrosilylation catalyst (solid content) relative to 100 parts by mass of the total amount of cage octasilsesquioxane and alkenyl group-containing polysiloxane is, for example, $1.0 \times 10^{-10}$ to 3 parts by mass, or preferably $1.0 \times 10^{-8}$ to 1 part by mass.

The mixing ratio of organohydrogenpolysiloxane is adjusted so that a molar ratio (X/Y) (number of moles (X) of the hydrosilyl group relative to the number of moles (Y) subtracting the number of moles of the alkenyl group of the alkenyl group-containing polysiloxane from the number of moles of the hydrosilyl group of the cage octasilsesquioxane) is, for example, 0.001 to 1000, preferably 0.01 to 100. In other words, the mixing ratio of organohydrogenpolysiloxane relative to 100 parts by mass of a total amount of cage octasilsesquioxane and the alkenyl group-containing polysiloxane is, for example, 0.01 to 100 parts by mass, preferably 0.01 to 50 parts by mass.

The mixing ratio of organohydrogenpolysiloxane relative to the silicone resin composition as a whole is, for example, 0.01 to 50 mass %, preferably 0.01 to 30 mass %.

To prepare the silicone resin composition, preferably, a silicone resin precursor obtained by allowing a cage octasilsesquioxane and an alkenyl group-containing polysiloxane to react in the presence of a hydrosilylation catalyst, and organohydrogenpolysiloxane are blended.

That is, first, a cage octasilsesquioxane is allowed to react with an alkenyl group-containing polysiloxane in the presence of a hydrosilylation catalyst at a mixing ratio such that the number of moles of the hydrosilyl group of the cage octasilsesquioxane is larger (in excess) than the number of moles of the alkenyl group of the alkenyl group-containing polysiloxane, thereby producing a silicone resin precursor.

To obtain the silicone resin precursor, to be more specific, the above-described cage octasilsesquioxane and the alkenyl group-containing polysiloxane are blended at the above-described mixing ratio along with a hydrosilylation catalyst, and as necessary, a solvent, and thereafter, as necessary, the mixture is heated.

Examples of solvents include aromatic hydrocarbons such as toluene, aliphatic hydrocarbons such as hexane, and esters such as ethyl acetate. Preferably, in view of compatibility among components, aromatic hydrocarbon, more preferably, toluene is used.

The reaction temperature is, for example, 0 to 100° C., or preferably 20 to 80° C., and the reaction time is, for example, 0.5 to 96 hours.

In this manner, cage octasilsesquioxane is allowed to react with the alkenyl group-containing polysiloxane. That is, the hydrosilyl group of the cage octasilsesquioxane and the alkenyl group of the alkenyl group-containing polysiloxane undergo hydrosilylation reaction.

The degree of hydrosilylation reaction between the hydrosilyl group of the cage octasilsesquioxane and the alkenyl group of the alkenyl group-containing polysiloxane can be checked by $^1$H-NMR measurement based on the signal intensity of the alkenyl group of the alkenyl group-containing polysiloxane, and the hydrosilylation reaction is regarded as terminated when the signal disappeared.

In the above-described hydrosilylation reaction, cage octasilsesquioxane is allowed to react with the alkenyl group-containing polysiloxane so that the number of moles of the hydrosilyl group is in excess compared with the number of moles of the alkenyl group, and after the reaction, the excess portion of the hydrosilyl group remains.

The silicone resin precursor is obtained in this manner.

The silicone resin precursor is liquid or semi-solid.

Then, the obtained silicone resin precursor and organohydrogenpolysiloxane are blended at the above-described ratio. By heating (described later) thereafter, the silicone resin precursor is allowed to react with the organohydrogenpolysiloxane. As necessary, the solvent was distilled off.

The silicone resin composition of the present invention can be obtained in this manner.

To the silicone resin composition, for example, those additives given as examples in the first embodiment can be added at an appropriate proportion to the extent that does not damage the excellent effects of the present invention.

The obtained silicone resin composition is solid. Due to steric hindrance of the cage octasilsesquioxane, the mobility of the alkenyl group-containing polysiloxane is reduced, and therefore a silicone resin composition in solid state can be obtained.

In the silicone resin composition of the present invention, the molar ratio of monovalent hydrocarbon group:hydrogen in R$^2$ is in a specific range, and therefore in the cage octasilsesquioxane, the proportion of the hydrosilyl group to be reacted with the alkenyl group of the alkenyl group-containing polysiloxane is adjusted. Moreover, the alkenyl group-containing polysiloxane is allowed to react with the cage octasilsesquioxane so that the alkenyl group thereof has the number of moles that is smaller than the number of moles of the hydrosilyl group of the cage octasilsesquioxane. Therefore, the obtained silicone resin composition has excellent transparency and heat resistance, and at the same time, can have both thermoplastic and thermosetting properties.

That is, the silicone resin composition is once plasticized (or liquefied) by the above-described heating, and thereafter, cured by heat.

Thermoplastic properties of the silicone resin composition are exhibited when the cage octasilsesquioxane and the alkenyl group-containing polysiloxane are heated and their mobility is increased.

The thermoplastic temperature of the silicone resin composition is, for example, 40 to 150° C., preferably 50 to 100° C. The thermoplastic temperature is a temperature at which the silicone resin composition exhibits thermoplastic properties, to be specific, a temperature at which a solid silicone resin composition is softened by heating and becomes liquid completely, and is substantially the same as the softening temperature.

The once plasticized silicone resin composition exhibits thermosetting properties, to be specific, by reaction of the hydrosilyl group remained in the silicone resin precursor and the hydrosilyl group in the organohydrogenpolysiloxane.

To be more specific, the hydrosilyl group of the cage octasilsesquioxane in the silicone resin precursor and the hydrosilyl group in the organohydrogenpolysiloxane are allowed to react with atmospheric moisture (hydrolysis), and subjected to dehydration (intermolecule dehydration) condensation reaction.

The thermosetting temperature of the silicone resin composition is relatively low, for example, 100 to 250° C., preferably 120 to 250° C. Thermal curing temperature is a temperature at which the silicone resin composition exhibits thermosetting properties, to be specific, a temperature at which the plasticized silicone resin composition is cured by heating and becomes solid completely.

In the silicone resin composition, the hydrosilyl group in the organohydrogenpolysiloxane is allowed to react with the residual hydrosilyl group in the cage octasilsesquioxane. That is, the dehydration (intermolecule dehydration) condensation reaction allows crosslinking to cage octasilsesquioxane. Therefore, improvement in flexibility of the silicone resin composition can be achieved.

Furthermore, the silicone resin composition achieves a decreased thermosetting temperature (e.g., 100 to 250° C.).

In the above-described embodiment, first, the silicone resin precursor is obtained, and thereafter, the silicone resin precursor and organohydrogenpolysiloxane are blended, thereby preparing a silicone resin composition, but the preparation method of the silicone resin composition is not limited thereto. The silicone resin composition can also be prepared by, for example, by blending at once cage octasilsesquioxane, the alkenyl group-containing polysiloxane, the hydrosilylation catalyst, and organohydrogenpolysiloxane; and as necessary, heating the mixture.

The silicone resin composition can be used, without limitation, for example, as an encapsulating material and a filler material for various industrial products. The silicone resin composition can be formed, preferably, as an encapsulating layer for various industrial products, to be specific, as an encapsulating layer for encapsulating an optical semiconductor element.

The optical semiconductor element is not particularly limited, as long as the optical semiconductor element is an element provided in an optical semiconductor device, and examples thereof include, a light-emitting diode (LED), a photodiode, a phototransistor, and a laser diode. A preferable example is an LED, a more preferable example is an LED for lighting.

Next, an embodiment of the optical semiconductor device of the present invention is described with reference to FIG. 1.

In FIG. 1, an optical semiconductor device 11 includes a substrate 3, an optical semiconductor element 1 mounted on the substrate 3, a housing 2 formed on the substrate 3, an encapsulating layer 7 that encapsulates the optical semiconductor element 1, and a phosphor layer 8 formed on the encapsulating layer 7.

The substrate 3, the optical semiconductor element 1, the housing 2, the encapsulating layer 7, and the phosphor layer 8 in the optical semiconductor device 11 are shaped and disposed in the same manner as in the first embodiment, and the substrate 3, the optical semiconductor element 1, the housing 2, and the phosphor layer 8 are formed from the same materials used in the first embodiment.

To obtain the optical semiconductor device 11, first, a substrate 3 is prepared, and then the optical semiconductor element 1 is mounted on the substrate 3: a housing 2 is formed separately on the substrate 3.

Then, the housing 2 is filled with the encapsulating layer 7. To be specific, the housing 2 is filled with the above-described silicone resin composition, and thereafter, as necessary the solvent is distilled off, and then the provided silicone resin composition is heated at the above-described temperature.

Then, the silicone resin composition is once plasticized (or liquefied) by the above-described heating and encapsulates the optical semiconductor element 1, and thereafter cured.

Thereafter, the phosphor layer 8 is formed on the encapsulating layer 7.

The optical semiconductor device 11 is obtained in this manner.

The encapsulating layer 7 is composed of the above-described silicone resin composition, and therefore by being plasticized by heating at the time of encapsulation and then being cured at low temperature, the optical semiconductor element 1 can be encapsulated while effectively preventing damages from impacts or overheating.

In the above-described optical semiconductor device 11, the optical semiconductor element 1 is encapsulated by the above-described encapsulating layer 7, and therefore has excellent optical properties and heat resistance, and also has excellent reliability, mechanical strength, and durability.

Furthermore, although in the embodiment of FIG. 1, the encapsulating layer 7 is formed from the silicone resin composition of the present invention, the housing 2 can also be formed from the silicone resin composition of the present invention.

In FIG. 1, the housing 2 as a reflector is formed from a light reflective composition containing a silicone resin composition and a light reflective component.

Examples of light reflective components include those given as examples of the light reflective component in the first embodiment, and the mixing ratio is also the same as the mixing ratio in the first embodiment.

The light reflective component is homogeneously dispersed and mixed in the silicone resin composition.

The light reflective composition is prepared by blending the above-described silicone resin composition and a light reflective component, and mixing the mixture homogenously.

The housing 2 is formed from the above-described light reflective composition by being molded into the above-described shape, and then heated. Also, the above-described silicone resin composition is contained, and therefore the housing 2 has excellent heat resistance, flexibility, thermoplastic properties, and thermosetting properties.

Therefore, the optical semiconductor device 11 including the above-described housing 2 has excellent optical properties and heat resistance, while at the same time has excellent flexibility, mechanical strength and durability.

Furthermore, in the optical semiconductor device 11 shown in FIG. 1, the encapsulating layer 7 is formed from the silicone resin composition, and at the same time, the housing 2 can be formed from the light reflective composition containing the silicone resin composition.

In this embodiment, operational advantages described above can be achieved.

Third Embodiment

The silicone resin composition of the present invention contains a cage octasilsesquioxane, a polysiloxane containing alkenyl groups at both ends, a hydrosilylation catalyst, a polysiloxane containing alkenyl groups at side chain.

Examples of cage octasilsesquioxanes include those cage octasilsesquioxanes given as examples in the first embodiment.

When the above-described molar ratio of monovalent hydrocarbon group:hydrogen in $R^2$ in formulas (1) and (2) is more than 6.5/1.5 (=6.5:1.5) (for example, when molar ratio of monovalent hydrocarbon group:hydrogen in $R^2$ in formulas (1) and (2) is 7/1 (=7:1)), the number of moles of the hydrosilyl group is significantly small, and therefore the reaction degree of the cage octasilsesquioxane relative to the polysiloxane containing alkenyl groups at both ends (and polysiloxane containing alkenyl groups at side chain) is decreased significantly, leading to a low molecular weight of the obtained silicone resin composition, and a failure to obtain a solid silicone resin composition.

On the other hand, when the above-described molar ratio of monovalent hydrocarbon group:hydrogen in $R^2$ is below 5.5/2.5 (=5.5:2.5) (for example, when the molar ratio of monovalent hydrocarbon group:hydrogen in $R^2$ is 5/3 (=5:3)), the number of moles of the hydrosilyl group of the cage octasilsesquioxane is excessively high, and therefore the reaction degree of the cage octasilsesquioxane relative to the polysiloxane containing alkenyl groups at both ends (and the polysiloxane containing alkenyl groups at side chain) is increased excessively, and the silicone resin composition does not exhibit thermoplastic properties.

The polysiloxane containing alkenyl groups at both ends is a straight chain polysiloxane containing alkenyl groups at both ends of its molecule; to be specific, examples thereof include those polysiloxanes containing alkenyl groups at both ends given as examples in the first embodiment and the represented by the above-described formula (3).

Examples of hydrosilylation catalysts include those hydrosilylation catalysts given as examples in the first embodiment.

The polysiloxane containing alkenyl groups at side chain is a polysiloxane containing two or more alkenyl groups at its side chain. Examples of such polysiloxanes containing alkenyl groups at side chain include a straight chain siloxane-containing polysiloxane (straight chain polysiloxane) which contains alkenyl groups in its side chain bonded to the (silicon atom of) main chain containing a straight chain siloxane portion (—Si—O—), and/or a branched siloxane-containing polysiloxane (branched polysiloxane) which contains alkenyl groups bonded to the silicon atom of the branched siloxane portion.

The straight chain siloxane-containing polysiloxane is, to be specific, represented by formula (8) below:

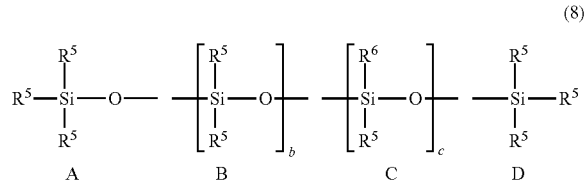

(8)

(where A to D represent constituent units; A and D represent terminal units; B and C represent repeating units; $R^5$ represents a monovalent hydrocarbon group; $R^6$ represents an alkenyl group; "b" represents 0 or an integer of 1 or more; and "c" represents an integer of 2 or more).

A to D constitute a straight chain siloxane-containing polysiloxane.

The monovalent hydrocarbon group represented by $R^5$ in formula (8) may be the same or different, and preferably the same.

Examples of the monovalent hydrocarbon group represented by $R^5$ include the above-described examples of the monovalent hydrocarbon group represented by $R^1$ in formulas (1) and (2). Preferable examples are methyl and phenyl, and a more preferable example is methyl.

In view of reactivity and stability, "b" is preferably an integer of 1 to 10000, more preferably an integer of 1 to 5000.

In view of reactivity and stability, "c" is preferably an integer of 2 to 500, more preferably an integer of 2 to 100.

The number average molecular weight of the straight chain siloxane-containing polysiloxane is, in view of stability and handleability, for example, 200 to 1000000, preferably 200 to 80000. The number average molecular weight of the straight chain siloxane-containing polysiloxane is determined by gel permeation chromatography (GPC: calibrated with polystyrene standards).

The alkenyl group content of the straight chain siloxane-containing polysiloxane is, for example, 0.01 to 10 mmol/g, preferably 0.1 to 5 mmol/g. The alkenyl group content of the straight chain siloxane-containing polysiloxane is measured using $^1$H-NMR based on the area ratio of the alkenyl group to the methyl group.

The straight chain siloxane-containing polysiloxane is synthesized in accordance with, for example, a known method. Alternatively, a commercially available product (e.g., manufactured by Gelest, Inc.) can also be used.

The branched siloxane-containing polysiloxane is, to be specific, represented by formula (9) below:

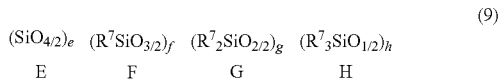

(9)

(where E to H represent constituent units; E to G represent repeating units; H represents a terminal unit; $R^7$ represents a monovalent hydrocarbon group; "e" represents an integer of 1 or more; "f" and "g" represent 0 or an integer of 1 or more; "h" represents an integer of 4 or more; and at least two $R^7$ groups are alkenyl groups per 1 molecule).

E to H constitute a branched siloxane-containing polysiloxane.

The monovalent hydrocarbon group represented by $R^7$ is, for example, a saturated hydrocarbon group, an aromatic hydrocarbon group, or an unsaturated hydrocarbon group (excluding aromatic hydrocarbon groups).

Examples of saturated hydrocarbon groups and aromatic hydrocarbon groups include the above-described examples of the monovalent hydrocarbon group represented by $R^1$ in formulas (1) and (2). Preferable examples are methyl and phenyl, and a more preferable example is methyl.

Examples of unsaturated hydrocarbon groups (excluding aromatic hydrocarbon groups) include the above-described examples of the alkenyl group represented by $R^4$ in formula (3), and a preferable example is vinyl.

The monovalent hydrocarbon group represented by $R^7$ in formula (9) includes at least an alkenyl group, preferably an alkyl group and an alkenyl group, more preferably a methyl group and a vinyl group.

The number of alkenyl groups in the branched siloxane-containing polysiloxane is 2 or more, preferably 3 or more, and usually 30 or less.

"e" is preferably an integer of 1 to 100, more preferably an integer of 1 to 50.

"f" is preferably an integer of 1 to 100, more preferably an integer of 1 to 50.

"g" is preferably an integer of 1 to 100, more preferably an integer of 1 to 50.

"h" is preferably an integer of 4 to 100, more preferably an integer of 4 to 30.

The number average molecular weight of the branched siloxane-containing polysiloxane is, in view of stability and handleability, for example, 100 to 10000, preferably 200 to 8000. The number average molecular weight of the branched siloxane-containing polysiloxane is determined by gel permeation chromatography (GPC: calibrated with polystyrene standards).

The alkenyl group content of the branched siloxane-containing polysiloxane is, for example, 0.01 to 100 mmol/g, preferably 0.1 to 10 mmol/g. The alkenyl group content of the branched siloxane-containing polysiloxane is measured using $^1$H-NMR based on the area ratio of the alkenyl group to the methyl group.

The branched siloxane-containing polysiloxane is synthesized in accordance with, for example, a known method. Alternatively, a commercially available product (e.g., manufactured by Gelest, Inc.) can also be used.

The silicone resin composition of the present invention is prepared by blending cage octasilsesquioxane, a polysiloxane containing alkenyl groups at both ends, a hydrosilylation catalyst, and a polysiloxane containing alkenyl groups at side chain.

The mixing ratio of the cage octasilsesquioxane relative to the silicone resin composition is, for example, 10 to 80 mass %, preferably 10 to 70 mass %.

The mixing ratio of the polysiloxane containing alkenyl groups at both ends is adjusted so that the number of moles of the alkenyl group of the polysiloxane containing alkenyl groups at both ends is smaller than the number of moles of the hydrosilyl group of the cage octasilsesquioxane.

That is, the molar ratio of the alkenyl group to the hydrosilyl group (number of moles of the alkenyl group/number of moles of the hydrosilyl group) is below 1, for example, 0.10 to 0.99, preferably 0.20 to 0.99, more preferably 0.50 to 0.99. In other words, the mixing ratio of the polysiloxane containing alkenyl groups at side chain relative to 100 parts by mass of the total amount of cage octasilsesquioxane and the polysiloxane containing alkenyl groups at both ends is, for example, 0.001 to 30 parts by mass, preferably 0.01 to 20 parts by mass. The mixing ratio of the polysiloxane containing alkenyl groups at side chain relative to 100 parts by mass of the total amount of cage octasilsesquioxane and polysiloxane containing alkenyl groups at both ends is, for example, 0.01 to 100 parts by mass, preferably 0.1 to 50 parts by mass.

When the above-described molar ratio is more than the above-described range, the hydrosilyl group becomes fewer than the alkenyl group, and in such a case, after the reaction, surplus hydrosilyl groups do not remain sufficiently, and thermosetting properties cannot be imparted to the silicone resin composition.

On the other hand, when the above-described molar ratio is below the above-described range, hydrosilyl groups may remain excessively, and cage octasilsesquioxanes may be cured by hydrolysis between each other due to moisture in the air and by self-condensation, thus, flexibility may not be achieved.

The mixing ratio of the hydrosilylation catalyst (solid content) relative to 100 parts by mass of the total amount of cage octasilsesquioxane and the polysiloxane containing alkenyl groups at both ends is, for example, $1.0 \times 10^{-10}$ to 3 parts by mass, preferably $1.0 \times 10^{-8}$ to 1 part by mass.

The mixing ratio of the polysiloxane containing alkenyl groups at side chain is adjusted so that the molar ratio (X/Y) (the number of moles (X) of the alkenyl group relative to the number of moles (Y) subtracting the number of moles of the alkenyl group of the polysiloxane containing alkenyl groups at both ends from the number of moles of the hydrosilyl group of the cage octasilsesquioxane) is, for example, 0.001 to 1000, preferably 0.01 to 100.

To prepare the silicone resin composition, preferably, a silicone resin precursor obtained by allowing cage octasilsesquioxane to react with a polysiloxane containing alkenyl groups at both ends in the presence of a hydrosilylation catalyst; and a polysiloxane containing alkenyl groups at side chain are blended.

That is, first, cage octasilsesquioxane is allowed to react with the polysiloxane containing alkenyl groups at both ends in the presence of a hydrosilylation catalyst at a mixing ratio such that the number of moles of the hydrosilyl group of the cage octasilsesquioxane is larger than (in excess of) the number of moles of the alkenyl group of the polysiloxane containing alkenyl groups at both ends, thereby producing a silicone resin precursor.

To obtain the silicone resin precursor, to be more specific, the above-described cage octasilsesquioxane and the polysiloxane containing alkenyl groups at both ends are blended at the above-described mixing ratio along with a hydrosilylation catalyst, and as necessary, a solvent, and thereafter, as necessary, the mixture is heated.

Examples of solvents include aromatic hydrocarbons such as toluene, aliphatic hydrocarbons such as hexane, and esters such as ethyl acetate. Preferably, in view of compatibility among components, aromatic hydrocarbon is used, more preferably toluene is used.

The reaction temperature is, for example, 0 to 100° C., or preferably 20 to 80° C., and the reaction time is, for example, 0.5 to 96 hours.

In this manner, cage octasilsesquioxane is allowed to react with the polysiloxane containing alkenyl groups at both ends. That is, the hydrosilyl group of the cage octasilsesquioxane and the alkenyl group of the polysiloxane containing alkenyl groups at both ends undergo hydrosilylation reaction.

The degree of hydrosilylation reaction between the hydrosilyl group of the cage octasilsesquioxane and the alkenyl group of the polysiloxane containing alkenyl groups at both ends can be checked by $^1$H-NMR measurement based on the signal intensity of the alkenyl group of the polysiloxane containing alkenyl groups at both ends, and the hydrosilylation reaction is regarded as terminated when the signal disappeared.

In the above-described hydrosilylation reaction, cage octasilsesquioxane is allowed to react with the polysiloxane containing alkenyl groups at both ends so that the number of moles of the hydrosilyl group is in excess compared with the number of moles of the alkenyl group, and after the reaction, the excess portion of the hydrosilyl group remains.

The silicone resin precursor is obtained in this manner.

The silicone resin precursor is liquid or semi-solid.

Then, the obtained silicone resin precursor and the polysiloxane containing alkenyl groups at side chain are blended at the above-described ratio. By heating (described later) thereafter, the silicone resin precursor is allowed to react with the polysiloxane containing alkenyl groups at side chain. As necessary, the solvent was distilled off.

The silicone resin composition of the present invention can be obtained in this manner.

To the silicone resin composition, additives such as the ones given as examples in the first embodiment can be added at an appropriate proportion to the extent that does not damage the excellent effects of the present invention.

The obtained silicone resin composition is solid. Due to steric hindrance of the cage octasilsesquioxane, the mobility of the polysiloxane containing alkenyl groups at both ends is reduced, and therefore a silicone resin composition in solid state can be obtained.

In the silicone resin composition of the present invention, the molar ratio of monovalent hydrocarbon group:hydrogen in $R^2$ is in a specific range, and therefore in the cage octasilsesquioxane, the proportion of the hydrosilyl group to be reacted with the alkenyl group of the polysiloxane containing alkenyl groups at both ends is adjusted. Moreover, the polysiloxane containing alkenyl groups at both ends is allowed to react with cage octasilsesquioxane so that the alkenyl group thereof has the number of moles that is smaller than the number of moles of the hydrosilyl group of the cage octasilsesquioxane. Therefore, the obtained silicone resin composition has excellent transparency and heat resistance, and at the same time, can have both thermoplastic and thermosetting properties.

That is, the silicone resin composition is once plasticized (or liquefied) by the above-described heating, and thereafter, cured by heat.

Thermoplastic properties of the silicone resin composition are exhibited when cage octasilsesquioxane and the polysiloxane containing alkenyl groups at both ends are heated, which causes increase in their mobility.

The thermoplastic temperature of the silicone resin composition is, for example, 40 to 150° C., preferably 50 to 100° C. The thermoplastic temperature is a temperature at which the silicone resin composition exhibits thermoplastic properties, to be specific, a temperature at which a solid silicone resin composition is softened by heating and becomes liquid completely, and is substantially the same as the softening temperature.

The once plasticized silicone resin composition exhibits thermosetting properties, to be specific, by reaction between the hydrosilyl group remaining in the silicone resin precursor and the alkenyl group of the polysiloxane containing alkenyl groups at side chain.

To be more specific, the hydrosilyl group of the cage octasilsesquioxane in the silicone resin precursor and the alkenyl group of the polysiloxane containing alkenyl groups at side chain undergo hydrosilylation reaction.

The thermosetting temperature of the silicone resin composition is relatively low, for example, 100 to 250° C., preferably 120 to 250° C. The thermosetting temperature is a temperature at which the silicone resin composition exhibits thermosetting properties, to be specific, a temperature at which the plasticized silicone resin composition is cured by heating and becomes solid completely.

In the silicone resin composition, the alkenyl group of the polysiloxane containing alkenyl groups at side chain is allowed to react with the residual hydrosilyl group in the cage octasilsesquioxane, and such reaction allows crosslinking to the cage octasilsesquioxane. Therefore, improvement in flexibility of the silicone resin composition can be achieved.

Furthermore, the silicone resin composition achieves a decreased thermosetting temperature (e.g., 100 to 250° C.).

In the above-described embodiment, first, the silicone resin precursor is obtained, and thereafter, the silicone resin precursor and polysiloxane containing alkenyl groups at side chain are blended, thereby preparing a silicone resin composition, but the preparation method of the silicone resin composition is not limited thereto. The silicone resin composition can also be prepared by, for example, by blending at once cage octasilsesquioxane, a polysiloxane containing alkenyl groups at both ends, a hydrosilylation catalyst, and a polysiloxane containing alkenyl groups at side chain, and as necessary, heating the mixture.

The silicone resin composition can be used, without limitation, for example, as an encapsulating material and a filler material for various industrial products. The silicone resin composition can be formed, preferably, as an encapsulating layer for various industrial products, to be specific, as an encapsulating layer for encapsulating an optical semiconductor element.

The optical semiconductor element is not particularly limited, as long as the optical semiconductor element is an element provided in an optical semiconductor device, and examples thereof include a light-emitting diode (LED), a photodiode, a phototransistor, and a laser diode. A preferable example is an LED, a more preferable example is an LED for lighting.

Next, an embodiment of the optical semiconductor device of the present invention is described with reference to FIG. 1.

In FIG. 1, an optical semiconductor device 11 includes a substrate 3, an optical semiconductor element 1 mounted on the substrate 3, a housing 2 formed on the substrate 3, an encapsulating layer 7 that encapsulates the optical semiconductor element 1, and a phosphor layer 8 formed on the encapsulating layer 7.

The substrate 3, the optical semiconductor element 1, the housing 2, the encapsulating layer 7, and the phosphor layer 8 in the optical semiconductor device 11 are shaped and disposed in the same manner as in the first embodiment, and the substrate 3, the optical semiconductor element 1, the housing 2, and the phosphor layer 8 are formed from the same materials used in the first embodiment.

To obtain the optical semiconductor device 11, first, a substrate 3 is prepared, and then the optical semiconductor element 1 is mounted on the substrate 3: a housing 2 is formed separately on the substrate 3.

Then, the housing 2 is filled with the encapsulating layer 7. To be specific, the housing 2 is filled with the above-described silicone resin composition, and thereafter, as necessary the solvent is distilled off, and then the provided silicone resin composition is heated at the above-described temperature.

Then, the silicone resin composition is once plasticized (or liquefied) by the above-described heating and encapsulates the optical semiconductor element 1, and thereafter cured.

Thereafter, the phosphor layer 8 is formed on the encapsulating layer 7.

The optical semiconductor device 11 is obtained in this manner.

The encapsulating layer 7 is composed of the above-described silicone resin composition, and therefore by being plasticized by heating at the time of encapsulation and then being cured at low temperature, the optical semiconductor element 1 can be encapsulated while effectively preventing damages from impacts or overheating.

In the above-described optical semiconductor device 11, the optical semiconductor element 1 is encapsulated by the above-described encapsulating layer 7, and therefore has excellent optical properties and heat resistance, and also has excellent reliability, mechanical strength, and durability.

Furthermore, although in the embodiment of FIG. 1, the encapsulating layer 7 is formed from the silicone resin composition of the present invention, the housing 2 can also be formed from the silicone resin composition of the present invention.

In FIG. 1, the housing 2 as a reflector is formed from a light reflective composition containing a silicone resin composition and a light reflective component.

Examples of light reflective components include those given as examples of the light reflective component in the first embodiment, and the mixing ratio is also the same as the mixing ratio in the first embodiment.

The light reflective component is homogeneously dispersed and mixed in the silicone resin composition.

The light reflective composition is prepared by blending the above-described silicone resin composition and a light reflective component, and mixing the mixture homogenously.

The housing 2 is formed from the above-described light reflective composition by being molded into the above-described shape, and then heated. Also, the above-described silicone resin composition is contained, and therefore the housing 2 has excellent heat resistance, flexibility, thermoplastic properties, and thermosetting properties.

Therefore, the optical semiconductor device 11 including the above-described housing 2 has excellent optical properties and heat resistance, while at the same time has excellent flexibility, mechanical strength, and durability.

Furthermore, in the optical semiconductor device 11 shown in FIG. 1, the encapsulating layer 7 is formed from the silicone resin composition, and at the same time, the housing 2 can also be formed from the light reflective composition containing the silicone resin composition.

In this embodiment, operational advantages described above can be achieved.

EXAMPLES

While the present invention is described in further detail with reference to Synthesis Examples, Comparative Synthesis Examples, Examples, and Comparative Examples in the following, the present invention is not limited to any of them by no means.

Synthesis Example 1

Synthesis of Cage Octasilsesquioxane 35.8 mL (160.6 mol) of tetraethoxysilane was gradually added dropwise to a liquid mixture of 66.8 mL (158.6 mol) of tetramethyl ammonium hydroxide (25% methanol solution), 32.8 mL of methanol, and 24.6 mL of distilled water. The mixture was stirred for a whole day, thereby allowing the mixture to react.

Then, the reaction liquid was filtered, and the filtrate was added dropwise to a liquid mixture of 428 mL of hexane, 7.1 g (75 mmol) of dimethylchlorosilane, and 24.4 g (225 mmol) of trimethylchlorosilane, and the mixture was stirred for a whole day. Thereafter, the reactant was extracted with hexane; and magnesium sulfate was added to the extract and dried. Thereafter, hexane was removed once, and then hexane was further added for recrystallization, thereby producing a white solid cage octasilsesquioxane.

It was confirmed that, by using $^1$H-NMR, the obtained cage octasilsesquioxane had the structure of formula (2); and that $R^1$ was a methyl group and $R^2$ was hydrogen and a methyl group in formula (2). The molar ratio of methyl group to hydrogen in $R^2$ (average value of cage octasilsesquioxane as a whole) was calculated and determined to be methyl group:hydrogen=6:2.

Synthesis Example 2 and Comparative Synthesis Examples 1 and 2

Cage octasilsesquioxanes of Synthesis Example 2, and Comparative Synthesis Examples 1 and 2 were obtained in the same manner as in Synthesis Example 1, except that the mixing ratios of dimethylchlorosilane and trimethylchlorosilane were changed in accordance with Table 1.

It was confirmed that, by using $^1$H-NMR, the obtained cage octasilsesquioxane had the structure of formula (2), and groups of $R^1$ and $R^2$ in formula (2) were identified. The molar ratio of methyl group to hydrogen in $R^2$ (average value of cage octasilsesquioxane as a whole) was calculated. The results are shown in Table 1.

blended, and the mixture was stirred at 50° C. for 15 hours. The silicone resin precursor was obtained in this manner. The molar ratio (=vinyl group/hydrosilyl group) of the vinyl group of the alkenyl group-containing polysiloxane to the hydrosilyl group of the cage octasilsesquioxane was 0.91.

Thereafter, to the obtained silicone resin precursor, 0.06 g of a hydroxyl group-containing polysiloxane (in formula (4), $R^5$ was methyl group, "b" was 38, number average molecular weight 3000, manufactured by Gelest, Inc.) was blended, and the mixture was stirred. The ratio of the hydroxyl group of the hydroxyl group-containing polysiloxane relative to the residual hydrosilyl group in the silicone resin precursor was, in a molar ratio, 0.67.

Thereafter, toluene was distilled off, thereby producing a transparent solid silicone resin composition.

Example 2

A silicone resin precursor was obtained in the same manner as in Example 1, except that instead of 0.06 g of hydroxyl group-containing polysiloxane (in formula (3), $R^5$ was methyl group, "b" was 38, number average molecular weight 3000, manufactured by Gelest, Inc.), 0.06 g of hydroxyl group-containing polysiloxane (in formula (3), $R^5$ was methyl group, "b" was 1615, number average molecular weight 12000, manufactured by Gelest, Inc.) was blended, and then a transparent solid silicone resin composition was obtained.

The ratio of the hydroxyl group of the hydroxyl group-containing polysiloxane relative to the residual hydrosilyl group in the silicone resin precursor was, in a molar ratio, 0.67.

TABLE 1

|  |  |  | Synthesis Example | | Comparative Synthesis Example | |
| --- | --- | --- | --- | --- | --- | --- |
|  |  |  | Synthesis Example 1 | Synthesis Example 2 | Comparative Synthesis Example 1 | Comparative Synthesis Example 2 |
| Tetraethoxysilane | Blending | (g) | 35.8 | 35.8 | 35.8 | 35.8 |
|  | Amount | (mmol) | 160.6 | 160.6 | 160.6 | 160.6 |
| Dimethylchlorosilane | Blending | (g) | 7.1 | 8.9 | 3.5 | 10.6 |
|  | Amount | (mmol) | 75 | 93.8 | 37.5 | 112.5 |
| Trimethylchlorosilane | Blending | (g) | 24.4 | 22.4 | 28.5 | 20.4 |
|  | Amount | (mmol) | 225 | 206.5 | 262.5 | 187.5 |
| Formulas (1) and (2) |  | $R^1$ | Methyl Group | Methyl Group | Methyl Group | Methyl Group |
|  | $R^2$ | Methyl Group:Hydrogen (Molar Ratio) | 6:2 | 5.5:2.5 | 7:1 | 5:3 |

[1] Examples and Comparative Examples Corresponding to the First Invention Group Examples 1 to 4 and Comparative Examples 1 to 5

Example 1

0.36 g of cage octasilsesquioxane (in formula (2), $R^2$ ratio=methyl group:hydrogen (molar ratio)=6:2) of Synthesis Example 1, 0.24 g of an alkenyl group-containing polysiloxane (in formula (3), $R^3$ is methyl group, $R^4$ is vinyl group, "a" was 8, number average molecular weight 800, manufactured by Gelest, Inc.), 1 g of toluene, and 0.5 µL of a solution of platinum-divinylsiloxane complex (hydrosilylation catalyst, toluene solution, platinum concentration 2 mass %) were Example 3

A silicone resin precursor was obtained in the same manner as in Example 1, except that instead of 0.36 g of the cage octasilsesquioxane (in formula (2), $R^2$ ratio=methyl group:hydrogen (molar ratio)=6:2) of Synthesis Example 1, 0.29 g of cage octasilsesquioxane (in formula (2), $R^2$ ratio=methyl group:hydrogen (molar ratio)=5.5:2.5) of Synthesis Example 2 was blended, and then a transparent solid silicone resin composition was obtained.

The ratio of the hydroxyl group of the hydroxyl group-containing polysiloxane relative to the residual hydrosilyl group in the silicone resin precursor was, in a molar ratio, 0.67.

Example 4

A silicone resin precursor was obtained in the same manner as in Example 1, except that instead of 0.24 g of alkenyl group-containing polysiloxane (in formula (3), $R^3$ was methyl group, $R^4$ was vinyl group, "a" was 8, number average molecular weight 800, manufactured by Gelest, Inc.), 0.6 g of alkenyl group-containing polysiloxane (in formula (3), $R^3$ was methyl group, $R^4$ was vinyl group, "a" was 25, number average molecular weight 2000, manufactured by Gelest, Inc.) was blended, and then a transparent solid silicone resin composition was obtained.

The ratio of the hydroxyl group of the hydroxyl group-containing polysiloxane relative to the residual hydrosilyl group in the silicone resin precursor was, in a molar ratio, 0.67.

Comparative Example 1

A silicone resin precursor was obtained in the same manner as in Example 1, except that instead of 0.24 g of alkenyl group-containing polysiloxane (in formula (3), $R^3$ was methyl group, $R^4$ was vinyl group, "a" was 8, number average molecular weight 800, manufactured by Gelest, Inc.), 0.24 g of polysiloxane (in formula (3), both of $R^3$ and $R^4$ were methyl groups, "a" was 25, number average molecular weight 800, manufactured by Gelest, Inc.) containing no alkenyl group was blended, and then a cloudy oil silicone resin composition was obtained.

Comparative Example 2

A silicone resin precursor was obtained in the same manner as in Example 1, except that instead of 0.36 g of cage octasilsesquioxane (in formula (2), $R^2$ ratio=methyl group:hydrogen (molar ratio)=6:2) of Synthesis Example 1, 0.72 g of cage octasilsesquioxane (in formula (2), $R^2$ ratio=methyl group:hydrogen (molar ratio)=7:1) of Comparative Synthesis Example 1 was blended, and then a transparent oil silicone resin composition was obtained. The ratio of the hydroxyl group of the hydroxyl group-containing polysiloxane relative to the residual hydrosilyl group in the silicone resin precursor was, in a molar ratio, 0.67.

Comparative Example 3

A silicone resin precursor was obtained in the same manner as in Example 1, except that instead of 0.36 g of cage octasilsesquioxane (in formula (2), $R^2$ ratio=methyl group:hydrogen (molar ratio)=6:2) of Synthesis Example 1, 0.24 g of cage octasilsesquioxane (in formula (2), $R^2$ ratio=methyl group:hydrogen (molar ratio)=5:3) of Comparative Synthesis Example 2 was blended, and then a transparent solid (gel) silicone resin composition was obtained. The ratio of the hydroxyl group of the hydroxyl group-containing polysiloxane relative to the residual hydrosilyl group in the silicone resin precursor was, in a molar ratio, 0.67.

Comparative Example 4

The same operation as in Example 1 was performed, except that a solution of platinum-divinylsiloxane complex (hydrosilylation catalyst, toluene solution, platinum concentration 2 mass %) was not blended; and a silicone resin composition was obtained without obtaining a silicone resin precursor. That is, to the cage octasilsesquioxane and alkenyl group-containing polysiloxane, a hydroxyl group-containing polysiloxane was blended, and a cloudy oil silicone resin composition was obtained.

Comparative Example 5

A silicone resin precursor was obtained in the same manner as in Example 1, except that the hydroxyl group-containing polysiloxane (in formula (4), $R^5$ was methyl group, "b" was 38, number average molecular weight 3000, manufactured by Gelest, Inc.) was not blended, and this was regarded as a silicone resin composition. The silicone resin composition was in cloudy oil state.

Evaluation

1. Thermoplastic and Thermosetting Properties

Behaviors when heated of the silicone resin compositions of Examples 1 to 4 and Comparative Examples 1 to 5 were evaluated.

To be specific, samples having a size of 1 cm square were made from the silicone resin compositions of Examples 1 to 4, and Comparative Examples 3 and 5. The samples were placed on a hot plate and heated to 30 to 200° C., and their thermoplastic temperature and thermosetting temperature were measured with visual observation. The results are shown in Table 2.

The sample of Comparative Example 3 was solid, but did not soften by heat, and therefore its thermoplastic temperature could not be evaluated. The sample of Comparative Example 3 was solid, and therefore its thermosetting temperature could not be evaluated.

On the other hand, the samples of Comparative Examples 1, 2, and 4 were liquid, and therefore their thermoplastic temperatures could not be evaluated. Also, a predetermined amount (about 1 mL) of the samples of Comparative Examples 1, 2 and 4 were applied on a hot plate, and heated to 30 to 200° C. The samples were observed, but because the samples were not cured by heating, their thermosetting temperatures could not be evaluated.

2. Heat Resistance (Reduction Rate of Light Transmittance)

Transmittance of light at a wavelength of 450 nm of samples made as described above of Examples 1 to 4 was measured by a spectrophotometer (U4100, manufactured by Hitachi High-Technologies Corporation).

Thereafter, the samples were placed in a hot air dryer of 200° C. for a predetermined period. Then, after elapses of 24 hours and 168 hours, the samples were taken out from the hot air dryer, and transmittance of the taken samples of light at a wavelength of 450 nm was measured.

Then, the reduction rates (=(light transmittance after placement in the dryer/light transmittance before placement in the dryer)×100) of the light transmittance of the samples were calculated. The results are shown in Table 2.

3. Flexibility (Tensile Modulus and Elongation Percentage)

Samples having a thickness of 600 μm were made, and then placed in a hot air dryer of 200° C. The samples were taken out after an elapse of 24 hours, and their tensile modulus at 25° C., and elongation percentage at 25° C. were measured using a universal testing machine (autograph, manufactured by Shimadzu Corporation). The results are shown in Table 2.

TABLE 2

| | | Example 1 | Example 2 | Example 3 | Example 4 | Comparative Example 1 | Comparative Example 2 | Comparative Example 3 | Comparative Example 4 | Comparative Example 5 |
|---|---|---|---|---|---|---|---|---|---|---|
| Cage Octasilsesquioxane | Synthesis Example Comparative Synthesis Example | Synthesis Example 1 | Synthesis Example 1 | Synthesis Example 2 | Synthesis Example 1 | Synthesis Example 1 | Comparative Synthesis Example 1 | Comparative Synthesis Example 2 | Synthesis Example 1 | Synthesis Example 1 |
| | $R^2$/Methyl Group:Hydrogen (Molar Ratio) | 6:2 | 6:2 | 5.5:2.5 | 6:2 | 6:2 | 7:1 | 5:3 | 6:2 | 6:2 |
| Alkenyl group-containing polysiloxane | Blending Amount (g) | 0.36 | 0.36 | 0.29 | 0.36 | 0.36 | 0.72 | 0.24 | 0.36 | 0.36 |
| | $R^3$ | Methyl Group | Methyl Group | Methyl Group | Methyl Group | Methyl Group | Methyl Group | Methyl Group | Methyl Group | Methyl Group |
| | $R^4$ | Vinyl Group | Vinyl Group | Vinyl Group | Vinyl Group | Methyl Group | Vinyl Group | Vinyl Group | Vinyl Group | Vinyl Group |
| | Number average molecular weight | 800 | 800 | 800 | 2000 | 800 | 800 | 800 | 800 | 800 |
| | Blending Amount (g) | 0.24 | 0.24 | 0.24 | 0.6 | — | 0.24 | 0.24 | 0.24 | 0.24 |
| | Vinyl Group/Hydrosilyl Group (Molar Ratio) | 0.91 | 0.91 | 0.91 | 0.91 | — | 0.90 | 0.91 | 0.91 | 0.91 |
| | Hydrosilylation Catalyst | Solution of Platinum-Divinylsiloxane Complex | Solution of Platinum-Divinylsiloxane Complex | Solution of Platinum-Divinylsiloxane Complex | Solution of Platinum-Divinylsiloxane Complex | Solution of Platinum-Divinylsiloxane Complex | Solution of Platinum-Divinylsiloxane Complex | Solution of Platinum-Divinylsiloxane Complex | — | Solution of Platinum-Divinylsiloxane Complex |
| Hydroxyl Group-containing Polysiloxane | $R^5$ | Methyl Group | Methyl Group | Methyl Group | Methyl Group | Methyl Group | Methyl Group | Methyl Group | Methyl Group | — |
| | Number average molecular weight | 3000 | 12000 | 3000 | 3000 | 3000 | 3000 | 3000 | 3000 | — |
| | Blending Amount (g) | 0.06 | 0.06 | 0.06 | 0.06 | 0.06 | 0.06 | 0.06 | 0.06 | — |
| | Ratio (X/Y)[Molar Ratio] of Hydroxyl Group Relative to residual hydrosilyl group | 0.67 | 0.67 | 0.67 | 0.67 | 0.12 | 0.67 | 0.67 | — | — |
| Evaluation on Silicone Resin Composition | State at Room Temperature | Transparent Solid | Transparent Solid | Transparent Solid | Transparent Solid | Cloudy Oil | Transparent Oil | Transparent Solid | Cloudy Oil | Transparent Solid |
| | Thermoplastic Temperature (°C.) | 65 | 60 | 70 | 60 | —*1 | —*1 | —*2 | —*1 | 70 |
| | Thermosetting Temperature (°C.) | 180 | 180 | 180 | 180 | —*3 | —*3 | — | —*3 | 200 |
| | Heat Resistance Reduction Rate (%) of Light Transmittance 24 h | 99 | 99 | 99 | 99 | — | — | — | — | 99 |
| | 168 h | 98 | 99 | 98 | 98 | — | — | — | — | 98 |
| | Flexibility Tensile Modulus (MPa) | 0.02 | 0.01 | 0.03 | 0.01 | — | — | — | — | 0.06 |
| | Elongation Percentage (%) | 150 | 160 | 120 | 130 | — | — | — | — | 110 |

*¹Not Evaluated Because of Oil State
*²Not Plasticized
*³Not Cured

As is clear from Table 2, the silicone resin compositions of Examples 1 to 4 and Comparative Example 5 have both thermoplastic and thermosetting properties. Moreover, the silicone resin compositions of Examples 1 to 4 have a low thermosetting temperature, i.e., 180° C., and have excellent elongation.

On the other hand, the silicone resin compositions of Comparative Examples 1 to 4 do not have both thermoplastic and thermosetting properties.

To be specific, the silicone resin composition of Comparative Example 1 does not contain an alkenyl group-containing polysiloxane, and therefore hydrosilylation reaction did not occur, and the obtained silicone resin composition did not become solid at room temperature, but became liquid at room temperature. That is, the silicone resin composition of Comparative Example 1 does not have thermoplastic properties.

In the silicone resin composition of Comparative Example 2, a molar ratio of monovalent hydrocarbon group:hydrogen in $R^2$ in the cage octasilsesquioxane as a whole, as an average value, was 7:1, and the number of moles of the hydrosilyl group was small, and therefore the reaction degree of cage octasilsesquioxane and the alkenyl group-containing polysiloxane was reduced, causing a low molecular weight of the silicone resin composition, and the obtained silicone resin composition did not become solid at room temperature, but became liquid at room temperature. That is, the silicone resin composition of Comparative Example 2 did not have thermoplastic properties.

In the silicone resin composition of Comparative Example 3, the molar ratio of monovalent hydrocarbon group:hydrogen in $R^2$ in the cage octasilsesquioxane as a whole, as an average value, was 5:3, and the number of moles of the hydrosilyl group of the cage octasilsesquioxane was large, and the obtained silicone resin composition did not exhibit thermoplastic properties.

In the silicone resin composition of Comparative Example 4, the hydrosilylation catalyst was not blended, and therefore hydrosilylation reaction did not occur, and the silicone resin precursor could not be obtained. Moreover, the silicone resin composition did not become solid at room temperature, but became liquid at room temperature. That is, the silicone resin composition of Comparative Example 4 did not have thermoplastic properties.

The silicone resin composition of Comparative Example 5 had both thermoplastic and thermosetting properties, but compared with the silicone resin compositions of Examples 1 to 4, the thermosetting temperature was high, i.e., 200° C., and had a high modulus of elasticity and a low elongation percentage.

This is probably because the hydroxyl group-containing polysiloxane was not blended therein, and therefore cage octasilsesquioxane were cured by hydrolysis between each other due to moisture in the air and self-condensation, which caused a short crosslinking distance.

[2] Examples and Comparative Examples Corresponding to the Second Invention Group Examples 5 to 10 and Comparative Examples 6 to 10

Example 5

0.36 g of cage octasilsesquioxane (in formula (2), $R^2$ ratio=methyl group:hydrogen (molar ratio)=6:2) of Synthesis Example 1, 0.24 g of an alkenyl group-containing polysiloxane (in formula (3), $R^3$ was methyl group, $R^4$ was vinyl group, "a" was 8, number average molecular weight 800), 1 g of toluene, and 0.1 µL of a solution of platinum-divinylsiloxane complex (hydrosilylation catalyst, toluene solution, platinum concentration 2 mass %) were blended, and the mixture was stirred at 50° C. for 15 hours. The silicone resin precursor was obtained in this manner. The molar ratio (=vinyl group/hydrosilyl group) of the vinyl group of the alkenyl group-containing polysiloxane to the hydrosilyl group of the cage octasilsesquioxane was 0.91.

Thereafter, to the obtained silicone resin precursor, 0.03 g (5 parts by mass relative to 100 parts by mass of silicone resin precursor) of a side-chain type organohydrogenpolysiloxane (in formula (5), $R^5$ was methyl group, b=510, c=200; number average molecular weight 50000, SiH group-containing amount 4 mmol/g) was blended, and the mixture was stirred.

The ratio (X/Y) of the hydrosilyl group in the organohydrogenpolysiloxane relative to the residual hydrosilyl group in the silicone resin precursor was, in a molar ratio, 4.

Thereafter, toluene was distilled off, thereby producing a cloudy solid silicone resin composition. The side-chain type organohydrogenpolysiloxane content in the silicone resin composition was 4.7 mass %.

Example 6

A silicone resin precursor was obtained in the same manner as in Example 5, except that the blending amount of the side-chain type organohydrogenpolysiloxane (in formula (5), $R^5$ was methyl group, b=510, c=200; number average molecular weight 50000, SiH group-content 4 mmol/g) was changed from 0.03 g to 0.14 g (23.3 parts by mass relative to 100 parts by mass of silicone resin precursor), and then a cloudy solid silicone resin composition was obtained.

The ratio (X/Y) of the hydrosilyl group of the organohydrogenpolysiloxane relative to the residual hydrosilyl group in the silicone resin precursor was, in a molar ratio, 18.7, and the side-chain type organohydrogenpolysiloxane content in the silicone resin composition was 18.8 mass %.

Example 7

A silicone resin precursor was obtained in the same manner as in Example 5, except that instead of 0.03 g of the side-chain type organohydrogenpolysiloxane (in formula (5), $R^5$ was methyl group, b=510, c=200; number average molecular weight 50000, SiH group-content 4 mmol/g), 0.03 g (5 parts by mass relative to 100 parts by mass of the silicone resin precursor) of a side-chain type organohydrogenpolysiloxane (in formula (5), $R^5$ was methyl group, b=510, c=200; number average molecular weight 1000, SiH group-content 7 mmol/g) was blended; and then a cloudy solid silicone resin composition was obtained.

The ratio (X/Y) of the hydrosilyl group of the organohydrogenpolysiloxane relative to the residual hydrosilyl group in the silicone resin precursor was, in a molar ratio, 7, and the side-chain type organohydrogenpolysiloxane content in the silicone resin composition was 4.7 mass %.

Example 8

A silicone resin precursor was obtained in the same manner as in Example 5, except that instead of 0.03 g of the side-chain type organohydrogenpolysiloxane (in formula (5), $R^5$ was methyl group, b=510, c=200; number average molecular weight 50000, SiH group-content 4 mmol/g), 0.03 g (5 parts by mass relative to 100 parts by mass of silicone resin precursor) of both-ends type organohydrogenpolysiloxane (non-side chain hydrogen/hydrogen-terminated (both ends) organopolysiloxane, in formula (7), $R^6$ was methyl group, d=4; number average molecular weight 450, SiH group-content 4.4 mmol/g) was blended; and then a cloudy solid silicone resin composition was obtained.

The ratio (X/Y) of the hydrosilyl group of the organohydrogenpolysiloxane relative to the residual hydrosilyl group in the silicone resin precursor was, in a molar ratio, 4.4, and the both-ends type organohydrogenpolysiloxane content in the silicone resin composition was 4.7 mass %.

Example 9

A silicone resin precursor was obtained in the same manner as in Example 5, except that instead of 0.36 g of the cage octasilsesquioxane (in formula (2), $R^2$ ratio=methyl group: hydrogen (molar ratio)=6:2) of Synthesis Example 1, 0.29 g of the cage octasilsesquioxane (methyl group:hydrogen (molar ratio)=5.5:2.5) of Synthesis Example 2 was blended; and then a cloudy solid silicone resin composition was obtained.

The ratio (X/Y) of the hydrosilyl group of the organohydrogenpolysiloxane relative to the residual hydrosilyl group in the silicone resin precursor was, in a molar ratio, 4, and the side-chain type organohydrogenpolysiloxane content in the silicone resin composition was 5.4 mass %.

Example 10

A silicone resin precursor was obtained in the same manner as in Example 5, except that instead of 0.24 g of the alkenyl group-containing polysiloxane (in formula (3), $R^3$ was methyl group, $R^4$ was vinyl group, a=8; number average molecular weight 800), 0.6 g of the alkenyl group-containing polysiloxane (in formula (3), $R^3$ was methyl group, $R^4$ was vinyl group, a=25; number average molecular weight 2000) was blended, and then a cloudy solid silicone resin composition was obtained.

The ratio (X/Y) of the hydrosilyl group of the organohydrogenpolysiloxane relative to the residual hydrosilyl group in the silicone resin precursor was, in a molar ratio, 4, and the side-chain type organohydrogenpolysiloxane content in the silicone resin composition was 3.0 mass %.

Comparative Example 6

A silicone resin precursor was obtained in the same manner as in Example 5, except that instead of 0.24 g of the alkenyl group-containing polysiloxane (in formula (3), $R^3$ was methyl group, $R^4$ was vinyl group, a=8; number average molecular weight 800), 0.24 g of a polysiloxane (in formula (3), $R^3$ and $R^4$ were both methyl groups, a=8; number average molecular weight 800) that does not contain an alkenyl group was blended, and then a cloudy oil silicone resin composition was obtained.

Comparative Example 7

A silicone resin precursor was obtained in the same manner as in Example 5, except that instead of 0.36 g of the cage octasilsesquioxane (in formula (2), $R^2$ ratio=methyl group: hydrogen (molar ratio)=6:2) of Synthesis Example 1, 0.72 g of the cage octasilsesquioxane (methyl group:hydrogen (molar ratio)=7:1) of Comparative Synthesis Example 1 was blended, and then a cloudy oil silicone resin composition was obtained.

The ratio (X/Y) of the hydrosilyl group of the organohydrogenpolysiloxane relative to the residual hydrosilyl group in the silicone resin precursor was, in a molar ratio, 4. The side-chain type organohydrogenpolysiloxane content in the silicone resin composition was 3.0 mass %.

Comparative Example 8

A silicone resin precursor was obtained in the same manner as in Example 5, except that instead of 0.36 g of the cage octasilsesquioxane (in formula (2), $R^2$ ratio=methyl group: hydrogen (molar ratio)=6:2) of Synthesis Example 1, 0.24 g of the cage octasilsesquioxane (in formula (2), $R^2$ ratio=methyl group:hydrogen (molar ratio)=5:3) of Comparative Synthesis Example 2 was blended; and then a transparent solid (gel) silicone resin composition was obtained.

The ratio (X/Y) of the hydrosilyl group of the organohydrogenpolysiloxane relative to the residual hydrosilyl group in the silicone resin precursor was, in a molar ratio, 4. The side-chain type organohydrogenpolysiloxane content in the silicone resin composition was 5.9 mass %.

Comparative Example 9

The same operation as in Example 5 was performed, except that a solution of platinum-divinylsiloxane complex (hydrosilylation catalyst, toluene solution, platinum concentration 2 mass %) was not blended. A silicone resin composition was obtained without obtaining the silicone resin precursor. That is, organohydrogenpolysiloxane was blended to cage octasilsesquioxane and the alkenyl group-containing polysiloxane, thereby producing a cloudy oil silicone resin composition.

Comparative Example 10

A silicone resin precursor was obtained in the same manner as in Example 5, except that organohydrogenpolysiloxane (in formula (5), $R^5$ was methyl group, b=510, c=200; number average molecular weight 50000, SiH group-content 4 mmol/g) was not blended, and the silicone resin precursor was obtained as a silicone resin composition. The silicone resin composition was cloudy solid state.

Evaluation

1. Thermoplastic and Thermosetting Properties

Behaviors when heated of the silicone resin compositions of Examples 5 to 10 and Comparative Examples 6 to 10 were evaluated.

To be specific, samples having a size of 1 cm square were made from the silicone resin compositions of Examples 5 to 10 and Comparative Examples 8 and 10. The samples were placed on a hot plate and heated to 30 to 200° C., and their thermoplastic temperature and thermosetting temperature were measured with visual observation. The results are shown in Table 3.

The sample of Comparative Example 8 was solid, but did not soften by heat, and therefore its thermoplastic temperature could not be evaluated. Also, the sample of Comparative Example 8 was solid, and therefore its thermosetting temperature could not be evaluated.

On the other hand, the samples of Comparative Examples 6, 7, and 9 were liquid, and therefore their thermoplastic temperatures could not be evaluated. Also, a predetermined amount (about 1 mL) of the samples of Comparative Examples 6, 7, and 9 were applied on a hot plate, and heated to 30 to 200° C. The samples were observed, but because the samples were not cured by heating, their thermosetting temperatures could not be evaluated.

2. Heat Resistance (Reduction Rate of Light Transmittance)

Transmittance of light at a wavelength of 450 nm of the samples made as described above of Examples 5 to 10 and Comparative Example 10 was measured by a spectrophotometer (U4100, manufactured by Hitachi High-Technologies Corporation).

Thereafter, the samples were placed in a hot air dryer of 200° C. for a predetermined period. Then, after elapses of 24 hours and 168 hours, the samples were taken out from the hot air dryer, and transmittance of the taken samples of light at a wavelength of 450 nm was measured.

Then, the reduction rates (=(light transmittance after placement in the dryer/light transmittance before placement in the dryer)×100) of the light transmittance of the samples were calculated. The results are shown in Table 3.

3. Flexibility (Tensile Modulus and Elongation Percentage)

The tensile modulus and elongation percentage of the silicone resin compositions of Examples 5 to 10 and Comparative Example 10 were evaluated.

To be specific, samples having a thickness of 600 μm were made from the silicone resin compositions of Examples 5 to 10 and Comparative Example 10, and then placed in a hot air dryer of 200° C. The samples were taken out after an elapse of 24 hours, and their tensile modulus at 25° C., and elongation percentage at 25° C. were measured using a universal testing machine (autograph, manufactured by Shimadzu Corporation). The results are shown in Table 3.

TABLE 3

| | Example 5 | Example 6 | Example 7 | Example 8 | Example 9 | Example 10 | Comparative Example 6 | Comparative Example 7 | Comparative Example 8 | Comparative Example 9 | Comparative Example 10 |
|---|---|---|---|---|---|---|---|---|---|---|---|
| Cage octasilsesquioxane Synthesis Example | Synthesis Example 1 | Synthesis Example 1 | Synthesis Example 1 | Synthesis Example 1 | Synthesis Example 2 | Synthesis Example 1 | Synthesis Example 1 | Comparative Synthesis Example 1 | Comparative Synthesis Example 2 | Synthesis Example 1 | Synthesis Example 1 |
| R$^2$/Methyl Group:Hydrogen (Molar Ratio) | 6:2 | 6:2 | 6:2 | 6:2 | 5.5:2.5 | 6:2 | 6:2 | 7:1 | 5:3 | 6:2 | 6:2 |
| Alkenyl group-containing polysiloxane Blending Amount (g) | 0.36 | 0.36 | 0.36 | 0.36 | 0.29 | 0.36 | 0.36 | 0.72 | 0.24 | 0.36 | 0.36 |
| R$^3$ | Methyl Group | Methyl Group | Methyl Group | Methyl Group | Methyl Group | Methyl Group | Methyl Group | Methyl Group | Methyl Group | Methyl Group | Methyl Group |
| R$^4$ | Vinyl Group | Vinyl Group | Vinyl Group | Vinyl Group | Vinyl Group | Vinyl Group | Methyl Group | Vinyl Group | Vinyl Group | Vinyl Group | Vinyl Group |
| Number average molecular weight | 800 | 800 | 800 | 800 | 800 | 2000 | 800 | 800 | 800 | 800 | 800 |
| Vinyl Group/Hydrosilyl Group (Molar Ratio) Blending Amount (g) | 0.24 | 0.24 | 0.24 | 0.24 | 0.24 | 0.6 | — | 0.24 | 0.24 | 0.24 | 0.24 |
| | 0.91 | 0.91 | 0.91 | 0.91 | 0.91 | 0.91 | 0.24 | 0.90 | 0.91 | 0.91 | 0.91 |
| Hydrosilylation Catalyst | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | — | Solution of Platinum-Divinyl-siloxane Complex |
| Organohydrogenpolysiloxane Side-Chain Type R$^5$ | Methyl Group | Methyl Group | Methyl Group | — | Methyl Group | Methyl Group | Methyl Group | Methyl Group | Methyl Group | Methyl Group | — |
| Number average molecular weight | 50000 | 50000 | 1000 | — | 50000 | 50000 | 50000 | 50000 | 50000 | 50000 | — |
| Both-Ends Type R$^6$ | — | — | — | Methyl Group | — | — | — | — | — | — | — |
| Number average molecular weight | — | — | — | 450 | — | — | — | — | — | — | — |
| Blending Amount (g) | 0.03 | 0.14 | 0.03 | 0.03 | 0.03 | 0.03 | 0.03 | 0.03 | 0.03 | 0.03 | — |
| Ratio of Organohydrogenpolysiloxane relative to Silicone Resin Composition (mass %) | 4.7 | 18.8 | 4.7 | 4.7 | 5.4 | 3.0 | 4.7 | 3.0 | 5.9 | 4.7 | — |
| Ratio of Hydrosilyl Group (X/Y)*$^4$ | 4 | 18.7 | 7 | 4.4 | 4 | 4 | 0.36 | 4 | 4 | — | — |
| Evaluation on Silicone Resin Composition State at Room Temperature | Transparent Solid | Transparent Solid | Transparent Solid | Transparent Solid | Transparent Solid | Transparent Solid | Cloudy Oil | Transparent Oil | Transparent Solid | Cloudy Oil | Transparent Solid |
| Thermoplastic Temperature (° C.) | 70 | 60 | 68 | 60 | 70 | 60 | —*$^1$ | —*$^1$ | —*$^2$ | —*$^1$ | 70 |
| Thermosetting Temperature (° C.) | 180 | 180 | 180 | 180 | 180 | 180 | —*$^3$ | —*$^3$ | — | —*$^3$ | 200 |
| Heat Resistance Reduction Rate (%) of Light Transmittance 24 h | 99 | 97 | 98 | 98 | 99 | 99 | — | — | — | — | 99 |
| 168 h | 98 | 97 | 98 | 99 | 98 | 98 | — | — | — | — | 98 |

TABLE 3-continued

| | | Example . Comparative Example | | | | | | | | | | | |
|---|---|---|---|---|---|---|---|---|---|---|---|---|
| | | Example 5 | Example 6 | Example 7 | Example 8 | Example 9 | Example 10 | Comparative Example 6 | Comparative Example 7 | Comparative Example 8 | Comparative Example 9 | Comparative Example 10 |
| Flexibility | Tensile Modulus (MPa) | 0.08 | 1.32 | — | 0.01 | 0.1 | 0.01 | — | — | — | — | 0.06 |
| | Elongation Percentage (%) | 110 | 20 | — | 160 | 100 | 130 | — | — | — | — | 110 |

*[1]Not Evaluated Because of Oil State
*[2]Not Plasticized
*[3]Not Cured
*[4]Ratio (X/Y)[Molar Ratio] of Hydrosilyl Group of organohydrogenpolysiloxane relative to the residual hydrosilyl group in Silicone Resin Precursor As is clear from Table 3, the silicone resin compositions of Examples 5 to 10 and Comparative Example 10 have both thermoplastic and thermosetting properties. Moreover, the silicone resin compositions of Examples 5 to 10 have a low thermosetting temperature, i.e., 180° C. Furthermore, the silicone resin compositions of Examples 5 and 8 to 10 have excellent elongation, and the silicone resin composition of Example 6 has excellent tensile modulus.

On the other hand, the silicone resin compositions of Comparative Examples 6 to 9 do not have both thermoplastic and thermosetting properties.

To be specific, the silicone resin composition of Comparative Example 6 does not contain an alkenyl group-containing polysiloxane, and therefore hydrosilylation reaction did not occur, and the obtained silicone resin composition did not become solid at room temperature, but became liquid at room temperature. That is, the silicone resin composition of Comparative Example 6 does not have thermoplastic properties.

In the silicone resin composition of Comparative Example 7, a molar ratio of monovalent hydrocarbon group:hydrogen in $R^2$ in the cage octasilsesquioxane as a whole, as an average value, was 7:1, and the number of moles of the hydrosilyl group was small, and therefore the reaction degree of the cage octasilsesquioxane and the alkenyl group-containing polysiloxane was reduced, causing a low molecular weight of the obtained silicone resin composition, and the obtained silicone resin composition did not become solid at room temperature, but became liquid at room temperature. That is, the silicone resin composition of Comparative Example 7 did not have thermoplastic properties.

In the silicone resin composition of Comparative Example 8, the molar ratio of monovalent hydrocarbon group:hydrogen in $R^2$ in the cage octasilsesquioxane as a whole, as an average value, was 5:3, and the number of moles of the hydrosilyl group of the cage octasilsesquioxane was large, and the obtained silicone resin composition did not exhibit thermoplastic properties.

In the silicone resin composition of Comparative Example 9, the hydrosilylation catalyst was not blended, and therefore hydrosilylation reaction did not occur, and the silicone resin precursor could not be obtained. Moreover, the silicone resin composition did not become solid at room temperature, but became liquid at room temperature. That is, the silicone resin composition of Comparative Example 9 did not have thermoplastic properties.

The sample of Comparative Example 10 had both thermoplastic and thermosetting properties, but compared with the samples of Examples 5 to 10, its thermosetting temperature was high, i.e., 200° C.

This is probably because the organohydrogenpolysiloxane was not blended therein, and therefore cage octasilsesquioxane were cured by hydrolysis between each other due to moisture in the air and self-condensation, which caused a short crosslinking distance.

[3] Examples and Comparative Examples Corresponding to the Third Invention Group Examples 11 to 16 and Comparative Examples 11 to 15

Example 11

0.36 g of cage octasilsesquioxane (in formula (2), $R^2$ ratio=methyl group:hydrogen (molar ratio)=6:2) of Synthesis Example 1, 0.24 g of a polysiloxane containing alkenyl groups at both ends (in formula (3), $R^3$ was methyl group, $R^4$ was vinyl group, "a" was 8; number average molecular weight 800), 1 g of toluene, and 0.1 μL of a solution of platinum-divinylsiloxane complex (hydrosilylation catalyst, toluene solution, platinum concentration 2 mass %) were blended, and the mixture was stirred at 50° C. for 15 hours. The silicone resin precursor was obtained in this manner. The molar ratio (=vinyl group/hydrosilyl group) of the vinyl group of the polysiloxane containing alkenyl groups at both ends to the hydrosilyl group of the cage octasilsesquioxane was 0.91.

Thereafter, to the obtained silicone resin precursor, 0.03 g (5.0 parts by mass relative to 100 parts by mass of a total amount of cage octasilsesquioxane and polysiloxane containing alkenyl groups at both ends) of a straight chain siloxane-containing polysiloxane (in formula (8), $R^5$ was methyl group, $R^6$ was vinyl group, b=120, c=10; number average molecular weight 10000, vinyl group content 0.98 mmol/g) was blended, and the mixture was stirred.

The ratio (X/Y) of the vinyl group of the straight chain siloxane-containing polysiloxane relative to the residual hydrosilyl group in the silicone resin precursor was, in a molar ratio, 0.49.

Thereafter, toluene was distilled off, thereby producing a cloudy solid silicone resin composition.

The straight chain siloxane-containing polysiloxane content in the silicone resin composition was 4.8 mass %.

Example 12

A silicone resin precursor was obtained in the same manner as in Example 11, except that the blending amount of the straight chain siloxane-containing polysiloxane (in formula (8), $R^5$ was methyl group, $R^6$ was vinyl group, b=120, c=10; number average molecular weight 10000, vinyl group content 0.98 mmol/g) was changed from 0.03 g to 0.14 g (23.2 parts by mass relative to 100 parts by mass of a total amount of cage octasilsesquioxane and the polysiloxane containing alkenyl groups at both ends), and then a cloudy solid silicone resin composition was obtained.

The ratio (X/Y) of the vinyl group of the straight chain siloxane-containing polysiloxane relative to the residual hydrosilyl group in the silicone resin precursor was, in a molar ratio, 2.29, and the straight chain siloxane-containing polysiloxane content in the silicone resin composition was 18.8 mass %.

Example 13

A silicone resin precursor was obtained in the same manner as in Example 11, except that instead of 0.03 g of the straight chain siloxane-containing polysiloxane (in formula (8), $R^5$ was methyl group, $R^6$ was vinyl group, b=120, c=10; number average molecular weight 10000, vinyl group content 0.98 mmol/g), 0.03 g (5.0 parts by mass relative to 100 parts by mass of a total amount of cage octasilsesquioxane and polysiloxane containing alkenyl groups at both ends) of the straight chain siloxane-containing polysiloxane (in formula (8), $R^5$ was methyl group, $R^6$ was vinyl group, b=131, c=2; number average molecular weight 10000, vinyl group content 0.13 mmol/g) was blended, and then a cloudy solid silicone resin composition was obtained.

The ratio (X/Y) of the vinyl group of the straight chain siloxane-containing polysiloxane relative to the residual hydrosilyl group in the silicone resin precursor was, in a molar ratio, 0.065, and the straight chain siloxane-containing polysiloxane content was 4.8 mass %.

Example 14

A silicone resin precursor was obtained in the same manner as in Example 11, except that instead of 0.36 g of cage octasilsesquioxane (in formula (2), $R^2$ ratio=methyl group: hydrogen (molar ratio)=6:2) of Synthesis Example 1, 0.3 g of cage octasilsesquioxane (in formula (2), $R^2$ ratio=methyl group:hydrogen (molar ratio)=5.5:2.5) of Synthesis Example 2 was blended, and then a cloudy solid silicone resin composition was obtained.

The ratio (X/Y) of the vinyl group of the straight chain siloxane-containing polysiloxane relative to the residual hydrosilyl group in the silicone resin precursor was, in a molar ratio, 0.39, and the straight chain siloxane-containing polysiloxane content in silicone resin composition was 5.2 mass %.

Example 15

A silicone resin precursor was obtained in the same manner as in Example 11, except that instead of 0.24 g of the polysiloxane containing alkenyl groups at both ends (in formula (3), $R^3$ was methyl group, $R^4$ was vinyl group, a=8; number average molecular weight 800), 0.6 g of the polysiloxane containing alkenyl groups at both ends (in formula (3), $R^3$ was methyl group, $R^4$ was vinyl group, a=25; number average molecular weight 2000) was blended, and then a cloudy solid silicone resin composition was obtained.

The ratio (X/Y) of the vinyl group of the straight chain siloxane-containing polysiloxane relative to the residual hydrosilyl group in the silicone resin precursor was, in a molar ratio, 0.49, and the straight chain siloxane-containing polysiloxane content in the silicone resin composition was 3.0 mass %.

Example 16

A silicone resin precursor was obtained in the same manner as in Example 11, except that instead of 0.03 g of the straight chain siloxane-containing polysiloxane (in formula (8), $R^5$ was methyl group, $R^6$ was vinyl group, b=120, c=10; number average molecular weight 10000, vinyl group content 0.98 mmol/g), 0.03 g (5 parts by mass relative to 100 parts by mass of a total amount of cage octasilsesquioxane and polysiloxane containing alkenyl groups at both ends) of the branched siloxane-containing polysiloxane (in formula (9), $R^7$ was methyl group and vinyl group; number average molecular weight 2400, vinyl group content 0.4 to 0.6 mmol/g) was blended, and then a cloudy solid silicone resin composition was obtained.

The ratio (X/Y) of the vinyl group in the branched siloxane-containing polysiloxane relative to the residual hydrosilyl group in the silicone resin precursor was, in a molar ratio, 0.25, and the branched siloxane-containing polysiloxane content in the silicone resin composition was 4.8 mass %.

Comparative Example 11

A silicone resin precursor was obtained in the same manner as in Example 11, except that instead of 0.24 g of the polysiloxane containing alkenyl groups at both ends (in formula (3), $R^3$ was methyl group, $R^4$ was vinyl group, a=8; number average molecular weight 800), 0.24 g of a polysiloxane (in formula (3), $R^3$ and $R^4$ were both methyl groups, a=8; number average molecular weight 800) that does not contain alkenyl groups was blended, and then a cloudy oil silicone resin composition was obtained.

The ratio (X/Y) of the alkenyl group (X) of the polysiloxane containing alkenyl groups at side chain relative to the residual hydrosilyl group (Y) in the silicone resin precursor was, in a molar ratio, 0.04, and the polysiloxane containing alkenyl groups at side chain content in the silicone resin composition was 4.8 mass %.

Comparative Example 12

A silicone resin precursor was obtained in the same manner as in Example 11, except that instead of 0.36 g of the cage octasilsesquioxane (in formula (2), $R^2$ ratio=methyl group: hydrogen (molar ratio)=6:2) of Synthesis Example 1, 0.72 g of the cage octasilsesquioxane (in formula (2), $R^2$ ratio=methyl group:hydrogen (molar ratio)=7:1) of Comparative Synthesis Example 1 was blended, and then a cloudy oil silicone resin composition was obtained.

The ratio (X/Y) of the alkenyl group (X) of the polysiloxane containing alkenyl groups at side chain relative to the residual hydrosilyl group (Y) in the silicone resin precursor was, in a molar ratio, 0.49, and the polysiloxane containing alkenyl groups at side chain content in the silicone resin composition was 3M mass %.

Comparative Example 13

A silicone resin precursor was obtained in the same manner as in Example 11, except that instead of 0.36 g of the cage octasilsesquioxane (in formula (2), $R^2$ ratio=methyl group: hydrogen (molar ratio)=6:2) of Synthesis Example 1, 0.24 g of the cage octasilsesquioxane (in formula (2), $R^2$ ratio=methyl group:hydrogen (molar ratio)=5:3) of Comparative Synthesis Example 2 was blended, and then a transparent solid (gel) silicone resin composition was obtained.

The ratio (X/Y) of the alkenyl group (X) of the polysiloxane containing alkenyl groups at side chain relative to the residual hydrosilyl group (Y) in the silicone resin precursor was, in a molar ratio, 0.49, and the polysiloxane containing alkenyl groups at side chain content in the silicone resin composition was 5.9 mass %.

Comparative Example 14

The same operation as in Example 11 was performed, except that a solution of platinum-divinylsiloxane complex (hydrosilylation catalyst, toluene solution, platinum concentration 2 mass %) was not blended; and a silicone resin composition was obtained without obtaining a silicone resin precursor. That is, to the cage octasilsesquioxane and the polysiloxane containing alkenyl groups at both ends, a straight chain siloxane-containing polysiloxane was blended, and a cloudy oil silicone resin composition was obtained.

Comparative Example 15

A silicone resin precursor was obtained in the same manner as in Example 11, except that the straight chain siloxane-containing polysiloxane (in formula (8), $R^5$ was methyl group, $R^6$ was vinyl group, b=120, c=10; number average molecular weight 10000, vinyl group content 0.98 mmol/g) was not blended, and this was regarded as a silicone resin composition. The silicone resin composition was cloudy solid state.

Evaluation

1. Thermoplastic and Thermosetting Properties

Behaviors when heated of the silicone resin compositions of Examples 11 to 16 and Comparative Examples 11 to 15 were evaluated.

To be specific, samples having a size of 1 cm square were made from the silicone resin compositions of Examples 11 to 16, and Comparative Examples 13 and 15. The samples were placed on a hot plate and heated to 30 to 200° C., and their thermoplastic temperature and thermosetting temperature were measured with visual observation. The results are shown in Table 4.

The samples of Comparative Example 13 was solid, but did not soften by heat, and therefore its thermoplastic temperature could not be evaluated. The sample of Comparative Example 13 was solid, and therefore its thermosetting temperature could not be evaluated.

On the other hand, the samples of Comparative Examples 11, 12, and 14 were liquid, and therefore their thermoplastic temperatures could not be evaluated. Also, a predetermined amount of (about 1 mL) the samples of Comparative Examples 11, 12, and 14 were applied on a hot plate, and heated to 30 to 200° C. The samples were observed, but because the samples were not cured by heating, their thermosetting temperatures could not be evaluated.

2. Heat Resistance (Reduction Rate of Light Transmittance)

Transmittance of light at a wavelength of 450 nm of samples made as described above of Examples 11 to 16 and Comparative Example 15 was measured by a spectrophotometer (U4100, manufactured by Hitachi High-Technologies Corporation).

Thereafter, the samples were placed in a hot air dryer of 200° C. for a predetermined period. Then, after elapses of 24 hours and 168 hours, the samples were taken out from the hot air dryer, and transmittance of the taken samples of light at a wavelength of 450 nm was measured.

Then, the reduction rates (=(light transmittance after placement in the dryer/light transmittance before placement in the dryer)×100) of the light transmittance of the samples were calculated. The results are shown in Table 4.

3. Flexibility (Tensile Modulus and Elongation Percentage)

Samples made as described above of Examples 11 to 16 and Comparative Example 15 were evaluated for their (silicone resin composition) tensile modulus and elongation percentage.

To be specific, samples having a thickness of 600 μm were made from the silicone resin compositions of Examples 11 to 16 and Comparative Example 15, and then placed in a hot air dryer of 200° C. The samples were taken out after an elapse of 24 hours, and their tensile modulus at 25° C., and elongation percentage at 25° C. were measured using a universal testing machine (autograph, manufactured by Shimadzu Corporation). The results are shown in Table 4.

TABLE 4

| | | Example 11 | Example 12 | Example 13 | Example 14 | Example 15 | Example 16 | Comparative Example 11 | Comparative Example 12 | Comparative Example 13 | Comparative Example 14 | Comparative Example 15 |
|---|---|---|---|---|---|---|---|---|---|---|---|---|
| Cage octasilsesquioxane | Synthesis Example Comparative Synthesis Example | Synthesis Example 1 | Synthesis Example 1 | Synthesis Example 1 | Synthesis Example 2 | Synthesis Example 1 | Synthesis Example 1 | Synthesis Example 1 | Comparative Synthesis Example 1 | Comparative Synthesis Example 2 | Synthesis Example 1 | Synthesis Example 1 |
| | R²:Hydrogen (Molar Ratio) R²/Methyl Group/Hydrogen (Molar Ratio) | 6:2 | 6:2 | 6:2 | 5.5:2.5 | 6:2 | 6:2 | 6:2 | 7:1 | 5:3 | 6:2 | 6:2 |
| Polysiloxane containing alkenyl groups at both ends | Blending Amount (g) | 0.36 | 0.36 | 0.36 | 0.3 | 0.36 | 0.36 | 0.36 | 0.15 | 0.45 | 0.36 | 0.36 |
| | R³ | Methyl Group | Methyl Group | Methyl Group | Methyl Group | Methyl Group | Methyl Group | Methyl Group | Methyl Group | Methyl Group | Methyl Group | Methyl Group |
| | R⁴ | Vinyl Group | Vinyl Group | Vinyl Group | Vinyl Group | Vinyl Group | Vinyl Group | Methyl Group | Vinyl Group | Vinyl Group | Vinyl Group | Vinyl Group |
| | Number average molecular weight | 800 | 800 | 800 | 800 | 2000 | 800 | 800 | 800 | 800 | 800 | 800 |
| | Blending Amount (g) | 0.24 | 0.24 | 0.24 | 0.24 | 0.6 | 0.24 | 0.24 | 0.24 | 0.24 | 0.24 | 0.24 |
| Vinyl Group/Hydrosilyl Group (Molar Ratio) | | 0.91 | 0.91 | 0.91 | 0.91 | 0.91 | 0.91 | — | 0.90 | 0.91 | 0.91 | 0.91 |
| Hydrosilylation Catalyst | | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | Solution of Platinum-Divinyl-siloxane Complex | — | Solution of Platinum-Divinyl-siloxane Complex |
| Polysiloxane containing alkenyl groups at side chain | R⁵ | Methyl Group | Methyl Group | Methyl Group | Methyl Group | Methyl Group | — | Methyl Group | Methyl Group | Methyl Group | Methyl Group | — |
| | R⁶ | Vinyl Group | Vinyl Group | Vinyl Group | Vinyl Group | Vinyl Group | — | Vinyl Group | Vinyl Group | Vinyl Group | Vinyl Group | — |
| | R⁷ | — | — | — | — | — | Methyl Group/Vinyl Group | — | — | — | — | — |
| | Vinyl Group Content (mmol/g) | 0.98 | 0.98 | 0.13 | 0.98 | 0.98 | 0.4–0.6 | 0.98 | 0.98 | 0.98 | 0.98 | — |
| | Vinyl Equivalent (Eq/kg) | — | — | — | — | — | 2400 | — | — | — | — | — |
| | Number average molecular weight | 10000 | 10000 | 10000 | 10000 | 10000 | — | 10000 | 10000 | 10000 | 10000 | — |
| | Blending Amount (g) | 0.03 | 0.14 | 0.03 | 0.03 | 0.03 | 0.03 | 0.03 | 0.03 | 0.03 | 0.03 | — |
| Side chain alkenyl group containing polysiloxane content relative to Silicone Resin Composition (mass %)*⁴ | | 4.8 | 18.8 | 4.8 | 5.2 | 3.0 | 4.8 | 4.8 | 3.0 | 5.9 | 5.2 | — |
| Ratio of alkenyl group (X/Y)*⁴ | | 0.49 | 2.29 | 0.065 | 0.39 | 0.49 | 0.25 | 0.04 | 0.49 | 0.49 | — | — |
| Evaluation on Silicone Resin Composition | State at Room Temperature | Transparent Solid | Transparent Solid | Transparent Solid | Transparent Solid | Transparent Solid | Transparent Solid | Cloudy Oil | Transparent Oil | Transparent Solid | Cloudy Oil | Transparent Solid |
| | Thermoplastic Temperature (°C) | 60 | 60 | 60 | 65 | 60 | 60 | —*¹ | —*¹ | —*² | —*¹ | 70 |
| | Thermosetting Temperature (°C) | 160 | 160 | 165 | 160 | 170 | 150 | —*³ | —*³ | — | —*³ | 200 |
| Heat Resistance Reduction Rate (%) of Light Transmittance | 24 h | 98 | 98 | 98 | 98 | 99 | 99 | — | — | — | — | 99 |
| | 168 h | 98 | 97 | 98 | 97 | 98 | 98 | — | — | — | — | 98 |
| Flexibility | Tensile Modulus (MPa) | 0.37 | 0.42 | 0.19 | 0.41 | 0.32 | 0.24 | — | — | — | — | 0.06 |

TABLE 4-continued

| | Example | | | | | | Comparative Example | | | | |
|---|---|---|---|---|---|---|---|---|---|---|---|
| | Example 11 | Example 12 | Example 13 | Example 14 | Example 15 | Example 16 | Comparative Example 11 | Comparative Example 12 | Comparative Example 13 | Comparative Example 14 | Comparative Example 15 |
| Elongation Percentage (%) | 53 | 47 | 60 | 43 | 59 | 38 | — | — | — | — | 110 |

*[1] Not Evaluated Because of Oil State
*[2] Not Plasticized
*[3] Not Cured
*[4] Ratio of alkenyl group in side chain alkenyl group containing polysiloxane relative to residual hydrosilyl group in silicone resin precursor (X/Y) [Molar Ratio]

As is clear from Table 4, the silicone resin compositions of Examples 11 to 16 and Comparative Example 15 have both thermoplastic and thermosetting properties. Moreover, the silicone resin compositions of Examples 11 to 16 have a low thermosetting temperature, i.e., 150 to 170° C., and have excellent tensile modulus and elongation.

On the other hand, the silicone resin compositions of Comparative Examples 11 to 14 do not have both thermoplastic and thermosetting properties.

To be specific, the silicone resin composition of Comparative Example 11 does not contain the polysiloxane containing alkenyl groups at both ends, and therefore hydrosilylation reaction did not occur, and the obtained silicone resin composition did not become solid at room temperature, but became liquid at room temperature. That is, the silicone resin composition of Comparative Example 11 did not have thermoplastic properties.

In the silicone resin composition of Comparative Example 12, a molar ratio of monovalent hydrocarbon group:hydrogen in $R^2$ in the cage octasilsesquioxane as a whole, as an average value, was 7:1, and the number of moles of the hydrosilyl group was small, and therefore the reaction degree of the cage octasilsesquioxane and the polysiloxane containing alkenyl groups at both ends was reduced, causing a low molecular weight of the obtained silicone resin composition, and the obtained silicone resin composition did not become solid at room temperature, but became liquid at room temperature. That is, the silicone resin composition of Comparative Example 12 did not have thermoplastic properties.

In the silicone resin composition of Comparative Example 13, the molar ratio of monovalent hydrocarbon group:hydrogen in $R^2$ in the cage octasilsesquioxane as a whole, as an average value, was 5:3, and the number of moles of the hydrosilyl group of the cage octasilsesquioxane was large, and the obtained silicone resin composition did not exhibit thermoplastic properties.

In the silicone resin composition of Comparative Example 14, the hydrosilylation catalyst was not blended, and therefore hydrosilylation reaction did not occur, and the silicone resin precursor could not be obtained. Moreover, the silicone resin composition did not become solid at room temperature, but became liquid at room temperature. That is, the silicone resin composition of Comparative Example 14 did not have thermoplastic properties.

The silicone resin composition of Comparative Example 15 had both thermoplastic and thermosetting properties, but compared with the silicone resin compositions of Examples 11 to 16, the thermosetting temperature was high, i.e., 200° C., and the tensile modulus was low.

This is probably because the polysiloxane containing alkenyl groups at side chain was not blended therein, and therefore cage octasilsesquioxane were cured by hydrolysis between each other due to moisture in the air and self-condensation, which caused a short crosslinking distance.

While the illustrative embodiments of the present invention are provided in the above description, such is for illustrative purpose only and it is not to be construed as limiting in any manner. Modifications and variations of the present invention that will be obvious to those skilled in the art are to be covered by the following claims.

What is claimed is:

1. A silicone resin composition comprising:
   a cage octasilsesquioxane having a group represented by formula (1) below,
   an alkenyl group-containing polysiloxane containing an alkenyl group having the number of moles smaller than the number of moles of the hydrosilyl group of the cage octasilsesquioxane,
   a hydrosilylation catalyst, and
   a hydroxyl group-containing polysiloxane,

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

2. The silicone resin composition according to claim 1, wherein the cage octasilsesquioxane is represented by formula (2) below:

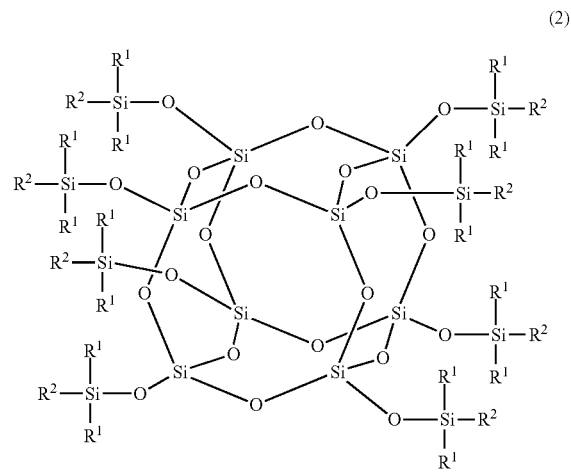

(where $R^1$ and $R^2$ are as defined above; and the molar ratio of monovalent hydrocarbon group:hydrogen in $R^2$ is the same as above).

3. The silicone resin composition according to claim 1, wherein the alkenyl group-containing polysiloxane is represented by formula (3) below:

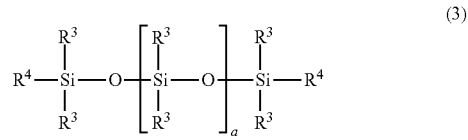

(where $R^3$ represents a monovalent hydrocarbon group; $R^4$ represents an alkenyl group; and "a" represents an integer of 1 or more).

4. The silicone resin composition according to claim 1, wherein the hydroxyl group-containing polysiloxane is represented by formula (4) below:

$$\text{HO}-\underset{\underset{R^5}{|}}{\overset{\overset{R^5}{|}}{Si}}-O-\left[\underset{\underset{R^5}{|}}{\overset{\overset{R^5}{|}}{Si}}-O\right]_b-\underset{\underset{R^5}{|}}{\overset{\overset{R^5}{|}}{Si}}-\text{OH} \quad (4)$$

(where $R^5$ represents a monovalent hydrocarbon group; and "b" represents an integer of 1 or more).

5. The silicone resin composition according to claim 1, comprising a silicone resin precursor and the hydroxyl group-containing polysiloxane,
wherein the silicone resin precursor is obtained by allowing the cage octasilsesquioxane to react with the alkenyl group-containing polysiloxane in the presence of the hydrosilylation catalyst.

6. An encapsulating layer used for encapsulating an optical semiconductor element,
wherein the encapsulating layer is formed from a silicone resin composition, and
the silicone resin composition comprises a cage octasilsesquioxane having a group represented by formula (1) below,
an alkenyl group-containing polysiloxane containing an alkenyl group having the number of moles smaller than the number of moles of the hydrosilyl group of the cage octasilsesquioxane,
a hydrosilylation catalyst, and
a hydroxyl group-containing polysiloxane, $$R^2-\underset{\underset{R^1}{|}}{\overset{\overset{R^1}{|}}{Si}}-O- \quad (1)$$

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

7. An optical semiconductor device comprising an optical semiconductor element and an encapsulating layer that encapsulates the optical semiconductor element,
wherein the encapsulating layer is formed from a silicone resin composition, and
the silicone resin composition comprises
a cage octasilsesquioxane having a group represented by formula (1) below,
an alkenyl group-containing polysiloxane containing an alkenyl group having the number of moles smaller than the number of moles of the hydrosilyl group of the cage octasilsesquioxane,
a hydrosilylation catalyst, and
a hydroxyl group-containing polysiloxane, $$R^2-\underset{\underset{R^1}{|}}{\overset{\overset{R^1}{|}}{Si}}-O- \quad (1)$$

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

8. A reflector used for reflecting light emitted from an optical semiconductor element,
wherein the reflector is formed from a light reflective composition containing a silicone resin composition and a light reflective component, and
the silicone resin composition comprises a cage octasilsesquioxane having a group represented by formula (1) below,
an alkenyl group-containing polysiloxane containing an alkenyl group having the number of moles smaller than the number of moles of the hydrosilyl group of the cage octasilsesquioxane,
a hydrosilylation catalyst, and
a hydroxyl group-containing polysiloxane, $$R^2-\underset{\underset{R^1}{|}}{\overset{\overset{R^1}{|}}{Si}}-O- \quad (1)$$

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

9. An optical semiconductor device comprising an optical semiconductor element and a reflector that reflects light emitted from the optical semiconductor element,
wherein the reflector is formed from a light reflective composition containing a silicone resin composition and a light reflective component, and
the silicone resin composition comprises
a cage octasilsesquioxane having a group represented by formula (1) below,
an alkenyl group-containing polysiloxane containing an alkenyl group having the number of moles smaller than the number of moles of the hydrosilyl group of the cage octasilsesquioxane,
a hydrosilylation catalyst, and
a hydroxyl group-containing polysiloxane, $$R^2-\underset{\underset{R^1}{|}}{\overset{\overset{R^1}{|}}{Si}}-O- \quad (1)$$

(where $R^1$ represents a monovalent hydrocarbon group; $R^2$ represents hydrogen or a monovalent hydrocarbon group; and the molar ratio of monovalent hydrocarbon group:hydrogen in $R^2$ in the cage octasilsesquioxane as a whole is, as an average value, in a range of 6.5:1.5 to 5.5:2.5).

* * * * *